US010586817B2

(12) United States Patent
Kuwabara et al.

(10) Patent No.: US 10,586,817 B2
(45) Date of Patent: Mar. 10, 2020

(54) SEMICONDUCTOR DEVICE, MANUFACTURING METHOD THEREOF, AND SEPARATION APPARATUS

(71) Applicant: Semiconductor Energy Laboratory Co., Ltd., Atsugi-shi, Kanagawa-ken (JP)

(72) Inventors: Hideaki Kuwabara, Atsugi (JP); Hiroki Adachi, Tochigi (JP); Satoru Idojiri, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 194 days.

(21) Appl. No.: 15/463,487

(22) Filed: Mar. 20, 2017

(65) Prior Publication Data

US 2017/0278878 A1    Sep. 28, 2017

(30) Foreign Application Priority Data

Mar. 24, 2016   (JP) .................................. 2016-059492

(51) Int. Cl.
*H01L 21/00* (2006.01)
*H01L 27/12* (2006.01)
(Continued)

(52) U.S. Cl.
CPC .... *H01L 27/1266* (2013.01); *H01L 21/67092* (2013.01); *H01L 21/67115* (2013.01);
(Continued)

(58) Field of Classification Search
CPC ............. H01L 27/1266; H01L 27/1218; H01L 21/67092; H01L 21/6835; H01L 21/67115; H01L 2221/68395; H01L 2221/6835
(Continued)

(56) References Cited

U.S. PATENT DOCUMENTS 5,952,708 A    9/1999   Yamazaki
5,969,463 A    10/1999  Tomita et al.
(Continued)

FOREIGN PATENT DOCUMENTS

JP         2013-038229 A     2/2013
WO    WO-2003/050963       6/2003
(Continued)

OTHER PUBLICATIONS

French.I et al., "54.2: Thin Plastic Electrophoretic Displays Fabricated by a Novel Process", SID Digest '05 : SID International Symposium Digest of Technical Papers, May 24, 2005, vol. 36, pp. 1634-1637.

(Continued)

*Primary Examiner* — Vu A Vu
(74) *Attorney, Agent, or Firm* — Robinson Intellectual Property Law Office; Eric J. Robinson

(57) ABSTRACT

A technique is described in which a transistor formed using an oxide semiconductor film, a transistor formed using a polysilicon film, a transistor formed using an amorphous silicon film or the like, a transistor formed using an organic semiconductor film, a light-emitting element, or a passive element is separated from a glass substrate by light or heat. An oxide layer is formed over a light-transmitting substrate, a metal layer is selectively formed over the oxide layer, a resin layer is formed over the metal layer, an element layer is formed over the resin layer, a flexible film is fixed to the element layer, the resin layer and the metal layer are irradiated with light through the light-transmitting substrate, the light-transmitting substrate is separated, and a bottom surface of the metal layer is made bare.

13 Claims, 18 Drawing Sheets

(51) Int. Cl.
*H01L 21/67* (2006.01)
*H01L 21/683* (2006.01)

(52) U.S. Cl.
CPC .. *H01L 21/6835* (2013.01); *H01L 2221/6835* (2013.01); *H01L 2221/68395* (2013.01)

(58) Field of Classification Search
USPC .......................................................... 438/795
See application file for complete search history.

(56) References Cited

U.S. PATENT DOCUMENTS

| | | | |
|---|---|---|---|
| 5,990,542 A | 11/1999 | Yamazaki | |
| 6,127,199 A | 10/2000 | Inoue et al. | |
| 6,372,608 B1 | 4/2002 | Shimoda et al. | |
| 6,521,511 B1 | 2/2003 | Inoue et al. | |
| 6,572,780 B2* | 6/2003 | McCormack | B32B 37/26 |
| | | | 156/155 |
| 6,645,830 B2 | 11/2003 | Shimoda et al. | |
| RE38,466 E | 3/2004 | Inoue et al. | |
| 6,707,614 B2 | 3/2004 | Tanaka | |
| 6,818,530 B2 | 11/2004 | Shimoda et al. | |
| 6,870,125 B2 | 3/2005 | Doi et al. | |
| 6,946,361 B2 | 9/2005 | Takayama et al. | |
| 7,050,835 B2 | 5/2006 | Hack et al. | |
| 7,094,665 B2 | 8/2006 | Shimoda et al. | |
| 7,189,631 B2 | 3/2007 | Yamazaki et al. | |
| 7,193,311 B2* | 3/2007 | Ogawa | H01L 21/6835 |
| | | | 257/678 |
| 7,285,476 B2 | 10/2007 | Shimoda et al. | |
| 7,335,573 B2 | 2/2008 | Takayama et al. | |
| RE40,601 E | 12/2008 | Inoue et al. | |
| 7,468,308 B2 | 12/2008 | Shimoda | |
| 7,473,928 B1 | 1/2009 | Yamazaki et al. | |
| 7,547,866 B2 | 6/2009 | Tanaka et al. | |
| 7,591,863 B2 | 9/2009 | Watanabe et al. | |
| 7,709,309 B2 | 5/2010 | Moriwaka | |
| 7,726,013 B2 | 6/2010 | Kimura | |
| 7,791,072 B2 | 9/2010 | Kumomi et al. | |
| 7,833,871 B2 | 11/2010 | Kawakami et al. | |
| 7,879,687 B2 | 2/2011 | Yamada | |
| 7,968,388 B2 | 6/2011 | Komatsu | |
| 8,048,777 B2 | 11/2011 | Eguchi et al. | |
| 8,110,442 B2 | 2/2012 | Jinbo | |
| 8,123,896 B2 | 2/2012 | Watanabe et al. | |
| 8,199,269 B2 | 6/2012 | Hattori et al. | |
| 8,202,365 B2 | 6/2012 | Umeda et al. | |
| 8,211,725 B2 | 7/2012 | Park et al. | |
| 8,222,092 B2 | 7/2012 | Yamazaki et al. | |
| 8,222,116 B2* | 7/2012 | Jinbo | H01L 27/1214 |
| | | | 438/458 |
| 8,227,353 B2 | 7/2012 | Omata et al. | |
| 8,237,166 B2 | 8/2012 | Kumomi et al. | |
| 8,264,144 B2* | 9/2012 | Oikawa | H01L 51/003 |
| | | | 313/512 |
| 8,274,079 B2 | 9/2012 | Yamazaki | |
| 8,415,208 B2 | 4/2013 | Takayama et al. | |
| 8,435,870 B2* | 5/2013 | Mikami | H01L 25/0657 |
| | | | 257/E21.09 |
| 8,597,965 B2 | 12/2013 | Hatano et al. | |
| 8,715,802 B2* | 5/2014 | Tsai | H01L 21/6835 |
| | | | 428/41.8 |
| 8,816,349 B2 | 8/2014 | Yamazaki et al. | |
| 8,895,974 B2 | 11/2014 | Sugimoto et al. | |
| 8,969,128 B2 | 3/2015 | Cho et al. | |
| 9,000,443 B2 | 4/2015 | Hatano | |
| 9,268,162 B2 | 2/2016 | Haskal | |
| 2002/0146893 A1 | 10/2002 | Shimoda et al. | |
| 2003/0144034 A1 | 7/2003 | Hack et al. | |
| 2004/0209442 A1 | 10/2004 | Takakuwa et al. | |
| 2008/0042168 A1 | 2/2008 | Watanabe et al. | |
| 2009/0269621 A1 | 10/2009 | Lifka et al. | |
| 2010/0073615 A1 | 3/2010 | Yaguchi et al. | |
| 2011/0156062 A1 | 6/2011 | Kim et al. | |
| 2011/0294244 A1 | 12/2011 | Hattori et al. | |
| 2012/0034451 A1 | 2/2012 | Seo et al. | |
| 2012/0228617 A1 | 9/2012 | Ko et al. | |
| 2012/0280229 A1 | 11/2012 | Suzuki et al. | |
| 2013/0341629 A1 | 12/2013 | Seo et al. | |
| 2014/0113440 A1 | 4/2014 | Tanaka et al. | |
| 2014/0234664 A1 | 8/2014 | Yasumoto et al. | |
| 2014/0339517 A1 | 11/2014 | Park et al. | |
| 2015/0041836 A1* | 2/2015 | Saito | H01L 33/46 |
| | | | 257/89 |
| 2015/0060778 A1 | 3/2015 | Kim et al. | |
| 2015/0151514 A1 | 6/2015 | Kikuchi et al. | |
| 2015/0210048 A1 | 7/2015 | Jeong et al. | |
| 2015/0303408 A1 | 10/2015 | Lee et al. | |
| 2017/0133450 A1 | 5/2017 | Yamazaki et al. | |

FOREIGN PATENT DOCUMENTS

| | | |
|---|---|---|
| WO | WO-2004/040648 | 5/2004 |
| WO | WO-2013/035298 | 3/2013 |

OTHER PUBLICATIONS

Lifka.H et al., "53.4: Ultra-Thin Flexible OLED Device", SID Digest '07 : SID International Symposium Digest of Technical Papers, May 22, 2007, vol. 38, pp. 1599-1602.

French.I et al., "58.4: Invited Paper: Flexible Displays and Electronics Made in AM-LCD Facilities by the EPLaRTM Process", SID Digest '07 : SID International Symposium Digest of Technical Papers, May 22, 2007, vol. 38, pp. 1680-1683.

Delmdahl.R et al., "Large-area laser-lift-off processing in microelectronics", Physics Procedia, Apr. 9, 2013, vol. 41, pp. 241-248, Elsevier.

* cited by examiner

FIG. 10A
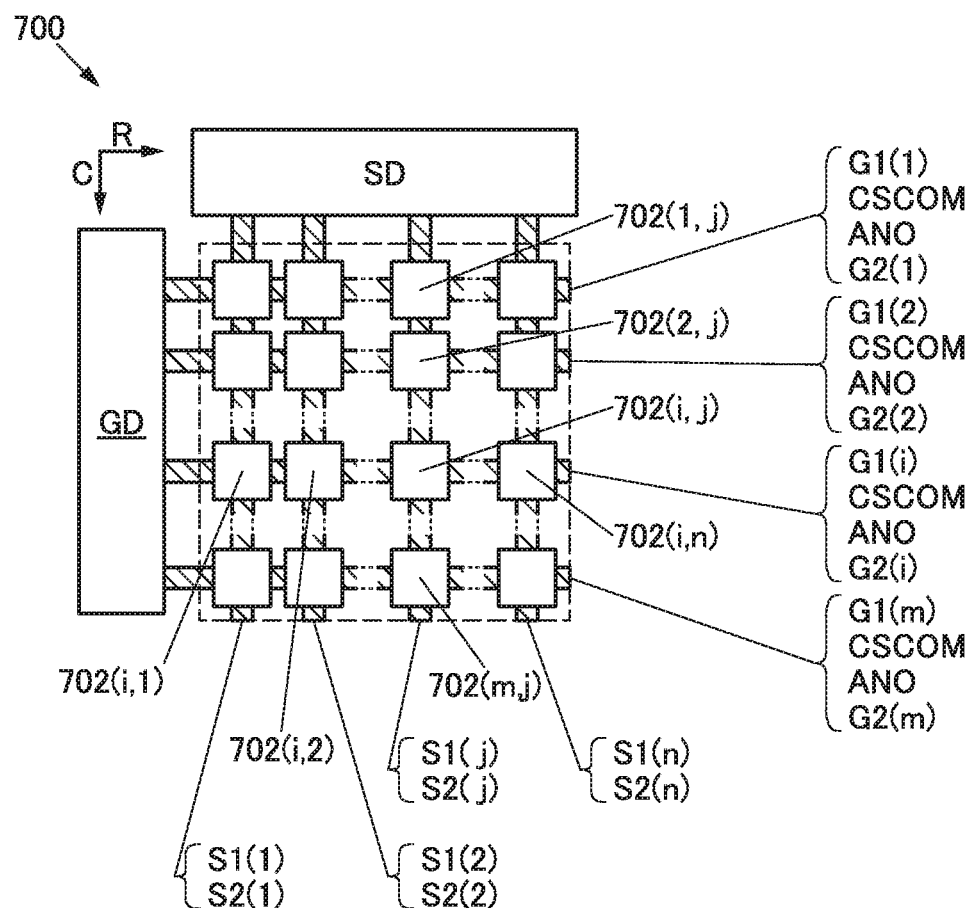
FIG. 10B1
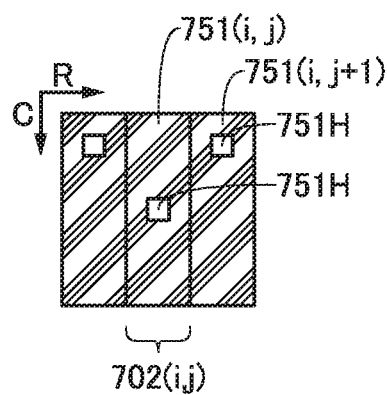
FIG. 10B2
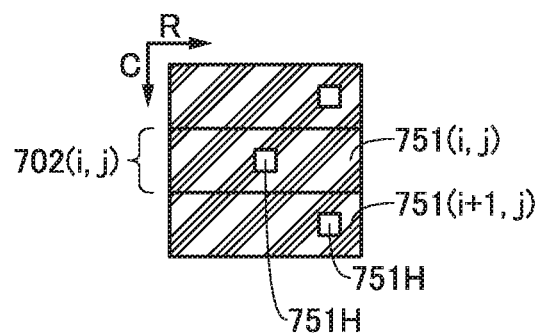

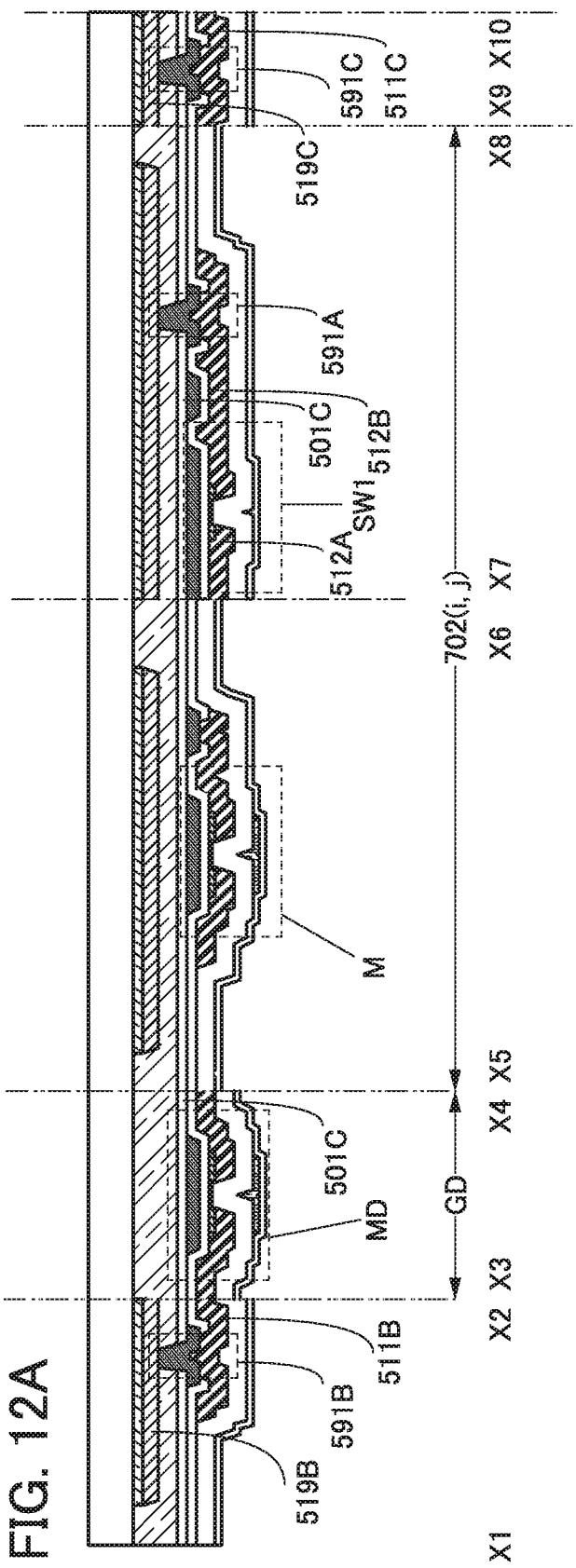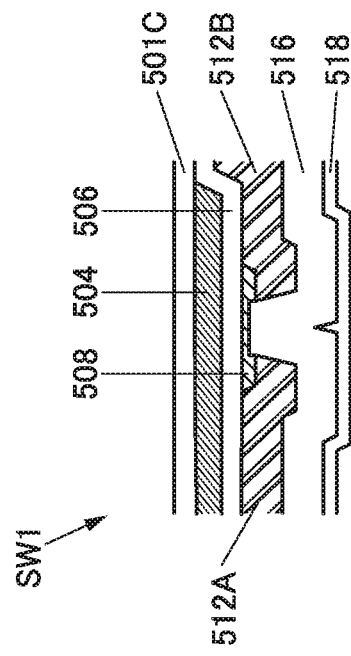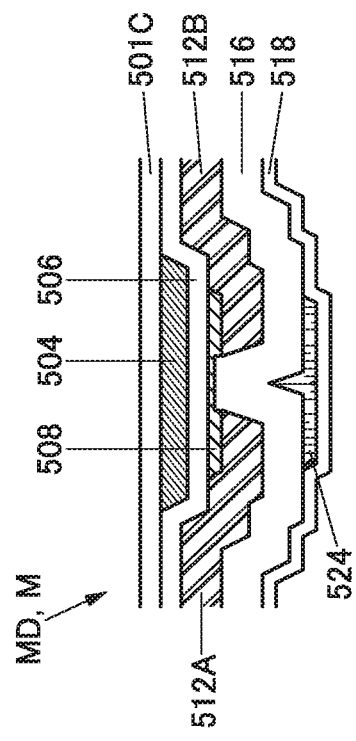

SEMICONDUCTOR DEVICE, MANUFACTURING METHOD THEREOF, AND SEPARATION APPARATUS

BACKGROUND OF THE INVENTION

1. Field of the Invention

One embodiment of the present invention relates to a semiconductor device and a manufacturing method thereof. One embodiment of the present invention also relates to a separation apparatus and a stack manufacturing apparatus.

Note that in this specification, a semiconductor device generally means a device that can function by utilizing semiconductor characteristics. An electrooptic device, a semiconductor circuit, and an electronic device are all semiconductor devices.

Note that one embodiment of the present invention is not limited to the above technical fields. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the invention disclosed in this specification and the like include a semiconductor device, a display device, a light-emitting device, a power storage device, a memory device, an electronic device, a lighting device, an input device (e.g., a touch sensor), an output device, an input/output device (e.g., a touch panel), a method for driving any of them, and a method for manufacturing any of them.

2. Description of the Related Art

Display devices used while being mounted on human bodies, such as display devices mounted on heads (e.g., head-mounted displays or glasses-type devices), have recently been proposed and are referred to as wearable displays. Furthermore, watch-type (also referred to as wristband-type) wearable devices are used through communication with tablet terminals.

Input devices such as a key board and a mouse are connected to a laptop computer. Tablet terminals have been in widespread use because they are more suitable for being carried around than laptop computers. In a tablet terminal which allows touch inputs, a touch panel is provided to overlap with a display portion. Input operation and the like can be performed by touching part of the touch panel overlapping with the screen of the display portion.

Various display devices have been test-fabricated, and an application to portable devices has particularly attracted attention. Glass substrates and quartz substrates are often used in recent years; however, they have disadvantages in that they are easily broken and they are heavy. In addition, increasing the size of glass substrates and quartz substrates is difficult, and glass substrates and quartz substrates are thus not suitable for mass production. For these reasons, forming transistors over flexible substrates, typically, flexible plastic films, is being attempted. When transistors are formed over plastic films, the process is limited to processes in which heating is not performed at temperatures higher than or equal to the heat-resistant temperatures of the plastic films.

Thus, technique in which an element formed over a glass substrate is separated from the substrate and transferred to another base, for example, a plastic film, has been proposed.

A separation and transfer technique with the use of a metal layer is proposed in Patent Document 1. In Patent Document 1, a technique in which a metal layer (Ti, Al, Ta, W, Mo, Cu, Cr, Nd, Fe, Ni, Co, Ru, Rh, Pd, Os, or Ir) is formed over a substrate and an oxide layer is stacked thereover is described. In this technique, when the oxide layer is formed, a metal oxide layer of the metal layer is formed at an interface between the metal layer and the oxide layer, and separation is carried out in a later step by utilizing this metal oxide layer.

In addition, a technique in which a metal layer in the periphery of a substrate is selectively etched, the left metal layer is irradiated with laser light, and a metal oxide layer is formed so as to carry out separation is described in Patent Document 1.

REFERENCE

Patent Document

[Patent Document 1] PCT International Publication No. WO2004/040648

SUMMARY OF THE INVENTION

As a method for manufacturing a device including a flexible film such as a plastic film, a technique has been developed in which a functional element such as a thin film transistor or an organic electroluminescence (hereinafter also referred to as EL) element is formed over a formation substrate (e.g., a glass substrate or a quartz substrate), and then the functional element is transferred to a flexible film. This technique needs a process of separating a layer to be separated including the functional element from the formation substrate (also referred to as a separation process).

In the present invention, a technique is disclosed in which a transistor formed using an oxide semiconductor film, a transistor formed using a polysilicon film, a transistor formed using an amorphous silicon film or the like, a transistor formed using an organic semiconductor film, a light-emitting element, or a passive element (such as a sensor element, an antenna, a resistor, or a capacitor), is separated from a glass substrate with light or heat.

One embodiment of the present invention relates to a flexible display device including an element and a method for manufacturing the flexible display device.

Although the transistor formed using an oxide semiconductor film, the transistor formed using an amorphous silicon film or the like, or the transistor formed using an organic semiconductor film can be formed directly on a plastic film, a dedicated manufacturing apparatus is required to handle a plastic film because it is softer than a glass substrate. When mass production is carried out, the manufacturing apparatus feeds plastic films in accordance with a roll-to-roll method.

In order to use a conventional manufacturing apparatus, a semiconductor element is sometimes provided over a plastic film in such a manner that the plastic film is fixed to a temporary substrate (e.g., a glass substrate), the semiconductor element is formed over the plastic film with the conventional manufacturing apparatus, and then the glass substrate is separated. A process for obtaining a flexible device in which a glass substrate is used for transportation and is finally separated in the above manner can also be used.

An object of one embodiment of the present invention is to provide a separation apparatus that enables easy separation in a large-area substrate.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to a flexible display device including a semiconductor element and a method for manufacturing the flexible display device.

One embodiment of the present invention is a method for manufacturing a semiconductor device in which an oxide layer is formed over a light-transmitting substrate, a metal layer is selectively formed over the oxide layer, a resin layer is formed over the metal layer, an element layer is formed over the resin layer, a flexible film is fixed to the element layer, the resin layer and the metal layer are irradiated with light through the light-transmitting substrate, the light-transmitting substrate is separated, and a bottom surface of the metal layer is made bare.

In the above manufacturing method, there is no particular limitation on a material for the light-transmitting substrate as long as it transmits later-emitted light. For example, a glass substrate or a quartz substrate is used. In addition, the light-transmitting substrate can be reused because it is separated in the later step.

In the above manufacturing method, an insulating layer containing silicon such as a silicon oxide film or a silicon oxynitride film can be used as the oxide layer, for example. Alternatively, an oxide semiconductor film, an In-M-Zn oxide film (M is Al, Ti, Ga, Y, Zr, La, Ce, Nd, Sn, or Hf) (e.g., an IGZO film that is a metal oxide film containing In, Ga, and Zn) can be used as the oxide layer. A metal oxide film that contains In, Ga, and Zn can be removed after the separation of the glass substrate because the metal oxide film is easy to remove by a wet etching. In addition, the metal oxide film may be used as a surface protective layer for the bare metal layer at the time of transportation and be removed just before being connected to an external terminal, for example.

In the above manufacturing method, the metal layer can be formed using tungsten, molybdenum, chromium, copper, silver, gold, nickel, an alloy of any of the elements (e.g., tungsten nitride), or the like by a CVD method or a sputtering method. The metal layer is preferably formed using a material which is hardly oxidized or a material which is conductive even when oxidized because the metal layer is made bare to be connected to an external terminal.

In the above manufacturing method, light emitted from a laser light source is used. As the laser light source, a XeCl excimer laser ($\lambda$=308 nm) or an ultraviolet laser ($\lambda$=355 nm) can be used. It is preferable that a plurality of laser light sources be used, a large-sized substrate be irradiated with laser light, and a rectangular or linear irradiation region be formed with optical systems including lenses, which makes it possible to shorten the process time. Flash lamp light may be used instead of the laser light. The use of the lamp is effective because light irradiation for a large area of the large-sized substrate can be performed in a short time.

Through the above manufacturing method, a thin film device in which the metal layer electrically connected to an electrode of the element layer is not covered can be provided. This metal layer can be used as a terminal electrode which is connected to an external terminal such as an FPC.

Conventional separation methods have problems in a portion to which an external terminal is connected because the conventional methods almost do not include a method for making an electrode bare on an exposed separated surface. For example, when a glass substrate is separated after a separation layer is formed over the glass substrate, an element is formed over the separation layer, and a terminal electrode is formed, the separation is performed in a state where a fixed film substrate is also attached to the terminal electrode. Therefore, the process is complex in order to remove part of the film substrate to make the terminal electrode bare, possibly resulting in decrease in the yield. In addition, the glass substrate is separated after an FPC is connected to the terminal electrode, which possibly results in poor connection of the FPC.

In a separation method of one embodiment of the present invention, a metal layer to be a terminal electrode can be bare on a bottom surface of the thin film device when an element formation surface of the thin film device is regarded as a top surface; therefore, an external terminal such as an FPC can be connected to the metal layer after the glass substrate is separated. In addition, when the element formation surface of the thin film device is regarded as a top surface, the metal layer to be the terminal electrode can be bare on the bottom surface, so that the element and the terminal electrode can be placed at the position where they overlap with each other. Specifically, the terminal electrode can be provided in a region overlapping with a driver circuit, which enables the total area to be reduced and the thin film device to be compact.

In the above manufacturing method, the resin layer can be formed using a material selected from an epoxy resin, an acrylic resin, a polyimide resin, a polyamide resin, and a polyamide-imide resin. The resin layer is formed by a printing method, a droplet discharging method, a coating method using a coater apparatus, or the like. This resin layer can be regarded as a base or as a second flexible film opposed to the flexible film provided over the element layer.

When used as the second flexible film, the resin layer preferably forms a stack with an inorganic insulating film serving as a barrier layer for blocking entry of impurities such as water to the element.

Depending on the formation apparatus, the resin layer might be formed at a side surface of the substrate and might be attached to not only the side surface but also the bottom surface of the substrate. In this case, light irradiation is not sufficiently performed at the peripheral portion of the substrate and the peripheral portion of the substrate is fixed by the resin layer, so that the separation might become difficult.

Thus, the resin layer formed on the side or bottom surface of the substrate is preferably removed in such a manner that side surface treatment is subjected to the substrate or a processing for cutting the substrate is performed before the substrate separation processing and the laser light irradiation are performed.

Alternatively, the resin layer formed on the side or bottom surface of the substrate may be removed in such a manner that side surface treatment is subjected to the substrate or a processing for cutting the substrate is performed after the laser light irradiation is performed and before the substrate separation processing is performed.

One embodiment of the present invention is a method for manufacturing a semiconductor device in which a resin layer is formed over a light-transmitting substrate, a barrier layer is formed over the resin layer, a layer including an element is formed over the barrier layer, a film is attached to the layer including the element, light irradiation is performed after side surface treatment is subjected to the substrate or a processing for cutting the substrate is performed, separation is started from the side surface of the substrate that is subjected to the side surface treatment or to the cutting processing, and the substrate is separated.

A separation apparatus for achieving the above manufacturing method is also one embodiment of the present invention. The separation apparatus has a function of dividing a process member including a first member and a second member, includes a support body supply unit, a support body hold unit, a direction changing mechanism, a substrate side surface treatment unit, a light irradiation unit, and a substrate separation unit. The substrate separation unit has a function of dividing the process member into the first member and the second member, and the direction changing mechanism has a function of changing a direction in which the support body is fed.

In the separation apparatus, the first member is a glass substrate and an oxide layer, and the second member is the metal layer, the resin layer, and the layer including the element.

It is preferable that the separation apparatus include a fixing mechanism. The fixing mechanism is configured to fix the second member at least part of which is separated from the first member.

It is preferable that the separation apparatus include a liquid supply mechanism. The liquid supply mechanism is configured to supply liquid (e.g., water, or an organic solvent) between the first member and the second member (or the separation surface).

It is preferable that the separation apparatus include a reel. The reel is located between the support body supply unit and the support body hold unit. A tape is bonded to one surface of the support body, and the reel is configured to wind up the tape.

It is preferable that the separation apparatus have an efficient structure in which light irradiation is performed through openings between a plurality of conveyor rollers. In this case, the width of the laser light irradiation region is made to be close to the substrate width.

In the separation method of this specification, a terminal electrode can be provided on a side opposed to a display surface because the terminal electrode can be bare on a separated surface. In the separation method of this specification, the terminal electrode can be bare on the separated surface, so that which substrate side to be used as the display surface of the panel can more freely selected. In addition, there are increased choices available: light-emitting elements (top- or bottom-emission elements), liquid crystal elements (transmissive or reflective elements), electronic ink, electrophoretic elements, and the like.

In the separation apparatus of this specification, the glass substrate can be efficiently separated and a semiconductor element can be provided over the plastic film.

BRIEF DESCRIPTION OF THE DRAWINGS

In the accompanying drawings:

FIGS. 10A, 10B1, and 10B2 illustrate structures of a display panel of an embodiment;

FIGS. 12A to 12C illustrate a method for manufacturing a display panel of an embodiment;

DETAILED DESCRIPTION OF THE INVENTION

Figure 1A:
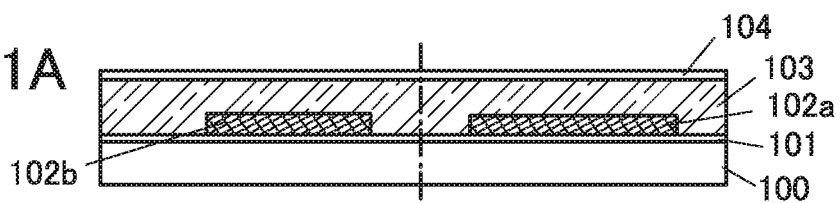
FIGS. 1A to 1E are cross-sectional views illustrating a manufacturing process of one embodiment of the present invention.

Hereinafter, embodiments of the present invention will be described in detail with reference to the drawings. Note that the present invention is not limited to the description below, and it is easily understood by those skilled in the art that modes and details of the present invention can be modified in various ways. Furthermore, the present invention is not construed as being limited to the description in the embodiments described below.

Embodiment 1

An example of a method for manufacturing a display device of one embodiment of the present invention will be described with reference to FIGS. 1A to 1E, and FIG. 2. Note that each of FIGS. 1A to 1E corresponds to a cross section of a peripheral circuit 132 along the dashed-dotted line A1-A2 in FIG. 2 and a cross section of a display region 131 along the dashed-dotted line A3-A4 in FIG. 2.

First, an oxide layer 101 is formed over a light-transmitting substrate 100 (also referred to as "an element formation substrate").

As the substrate 100, a glass substrate, a quartz substrate, a sapphire substrate, or the like can be used. As an example of a glass substrate, a barium borosilicate glass substrate, an aluminoborosilicate glass substrate, a soda lime glass substrate, or the like can be given.

The oxide layer 101 is formed using silicon oxide, silicon oxynitride, silicon nitride oxide, tungsten oxide, molybdenum oxide, gallium oxide, titanium oxide, or the like. The oxide layer 101 can be formed to have a single-layer structure or a stacked-layer structure using any of the materials. Alternatively, an In-M-Zn oxide film (M is Al, Ti, Ga, Y, Zr, La, Ce, Nd, Sn, or Hf) (e.g., an IGZO film that is a metal oxide film containing In, Ga, and Zn) can be used as the oxide layer 101. Since laser light irradiation is performed later, a film having a property of transmitting laser light is preferably used. The thickness of the oxide layer 101 can be selected from a range of greater than or equal to 1 nm and less than or equal to 500 nm.

Next, metal layers 102a and 102b are selectively formed over the oxide layer 101. The metal layers 102a and 102b are selectively formed in such a manner that a metal film is formed, a resist mask is formed over the metal film, and the metal film is selectively removed using the resist mask. The resist mask can be formed by a lithography method, a printing method, an inkjet method, or the like as appropriate. Formation of the resist mask by an inkjet method needs no photomask; thus, the manufacturing cost can be reduced.

The metal layers 102a and 102b can be formed using tungsten, molybdenum, chromium, copper, silver, gold, nickel, an alloy of any of the elements (e.g., tungsten nitride), or the like by a CVD method or a sputtering method. The metal layer 102a is preferably formed using a material which is hardly oxidized or a material which is conductive even when oxidized because the metal layer 102a is made bare to be connected to an external terminal. In this embodiment, tungsten is used. Each of the thicknesses of the metal layers 102a and 102b can be selected from a range of greater than or equal to 10 nm and less than or equal to 500 nm.

Subsequently, a resin layer 103 is formed over the metal layers 102a and 102b.

The resin layer 103 can be formed using an acrylic resin, a polyimide resin, a poly(methyl methacrylate) resin, a polycarbonate resin, a polyethersulfone resin, a polyamide resin, a cycloolefin resin, a polystyrene resin, a poly(amide imide) resin, a polypropylene resin, a polyester resin, a vinyl resin, an aramid resin, an epoxy resin, or the like. Alternatively, a mixture or a stack including any of these materials may be used.

Next, a barrier layer 104 is formed over the resin layer 103 (see FIG. 1A).

The barrier layer 104 can prevent or reduce diffusion of impurity elements from the outside. The barrier layer 104 is preferably formed as a single layer or a multilayer using any of silicon nitride, silicon oxynitride, silicon nitride oxide, aluminum oxide, aluminum oxynitride, aluminum nitride oxide, and the like. The barrier layer 104 also can prevent or reduce diffusion of impurity elements from the resin layer 103. The barrier layer 104 also can function as a light-blocking layer for preventing separation at an interface between the resin layer 103 and the barrier layer 104, which is generated by light irradiation for the resin layer 103 under the barrier layer 104 when a semiconductor layer of the transistor is irradiated with laser light in a later step.

A layer to be separated including a transistor 105, an electrode 109, and the like is formed over the barrier layer 104. The transistor 105 can be formed by a known formation method, and there is no particular limitation. In this embodiment, an amorphous silicon film is formed and then irradiated with laser light to be a polycrystalline silicon film, and the polycrystalline silicon film is used as the semiconductor layer. Although an example in which the polycrystalline silicon film is formed by laser light is described in this embodiment, one embodiment of the present invention is not limited thereto. The polycrystalline silicon film may be formed by heat processing at temperatures at which the resin layer can withstand.

When heat processing at temperatures higher than or equal to 410° C. is performed in the formation process of the transistor 105, a metal oxide layer (not illustrated) which is likely to cause separation is formed anew at an interface between the metal layer 102a and the oxide layer 101 in some cases. In this embodiment, when a metal oxide layer containing tungsten oxide is formed at the interface between the metal layer 102a and the oxide layer 101, separation can be performed without laser light irradiation to be performed in the later step, so that laser light irradiation for the metal layer 102a in the later step can be skipped.

An electrode 107 is electrically connected to the metal layer 102a through an opening formed by selectively etching an insulating layer 106, the barrier layer 104, and the resin layer 103.

The electrode 109 is electrically connected to one electrode 110 of a light-emitting element. The electrode 109 can also be called a drain electrode which is electrically connected to a semiconductor layer of the transistor in the display region.

Over the insulating layer 106, a partition 111 for separating the light-emitting elements is formed.

Next, an EL layer 112 and another electrode 113 of the light-emitting element are formed to complete the light-emitting element. This light-emitting element is a light-emitting element using electroluminescence (EL). Note that materials of the one electrode 110 of the light-emitting element and the other electrode 113 are selected as appropriate, so that the display device can also have a top-emission structure, a bottom-emission structure, or a dual-emission structure.

The EL layer 112 includes at least a light-emitting layer and may have a stacked structure including a functional layer in addition to the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

The light-emitting element can provide a variety of emission colors depending on the kinds of the light-emitting materials that are used for the EL layer 112. The use of light-emitting elements that can provide the respective emission colors of red, green, and blue, for example, can achieve full color display. In addition, a plurality of light-emitting materials of different colors are used as the light-emitting material, whereby light emission having a broad spectrum or white light emission can also be obtained. The light-emitting element that can provide white light emission is used in combination with a color filter, whereby full color display can be achieved.

Figure 1B:
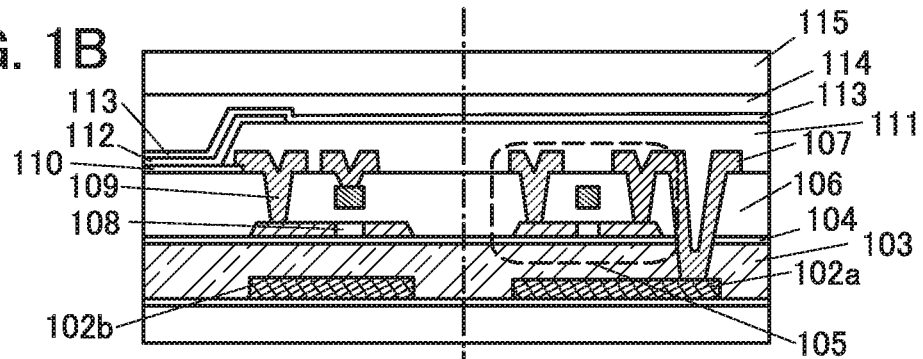

Next, a flexible film 115 is attached to the electrode 113 using an adhesive layer 114 (see FIG. 1B). The flexible film 115 may be a stacked film including an optical film such as a polarizing film or a color filter including a coloring layer.

The adhesive layer 114 can be formed using a light curable adhesive, a reactive curable adhesive, a thermal curable adhesive, or an anaerobic adhesive. For example, an epoxy resin, an acrylic resin, a silicone resin, a phenol resin, an imide resin, a poly(vinyl chloride) (PVC) resin, a poly (vinyl butyral) (PVB) resin, or an ethylene-vinyl acetate (EVA) resin can be used. In particular, a material with low moisture permeability, such as an epoxy resin, is preferred. Alternatively, a two-component type resin may be used. Still alternatively, an adhesive sheet or the like may be used.

Figure 1C:
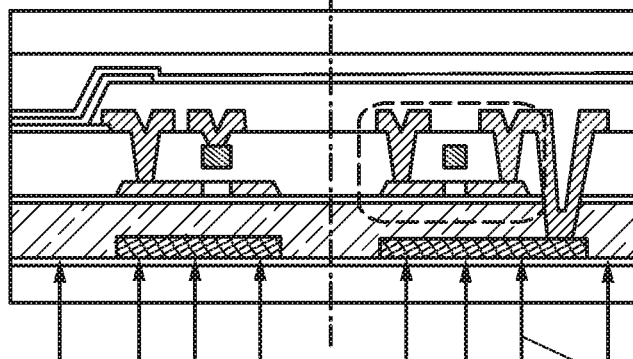

Next, the resin layer 103 is irradiated with light 210 that is transmitted through the substrate 100 (FIG. 1C). As the light 210, infrared light, visible light, or ultraviolet light emitted from a halogen lamp, a high pressure mercury lamp, or the like can be used. The wavelength of the light 210 is preferably greater than or equal to 400 nm and less than or equal to 1.2 μm, further preferably greater than or equal to 500 nm and less than or equal to 900 nm, or still further preferably greater than or equal to 500 nm and less than or equal to 700 nm. In this embodiment, a light source of a XeCl excimer laser (λ=308 nm) is used. It is preferable that a plurality of laser light sources be used, a large-sized substrate be irradiated with laser light, and a rectangular or linear irradiation region be formed with optical systems including lenses, which makes it possible to shorten the process time. Flash lamp light may be used instead of the laser light. The use of the flash lamp light source is effective because light irradiation for a large area of the large-sized substrate can be performed in a short time. A flash lamp light source and a laser light source may be used at the same time or used at different timings for irradiation.

A separation interface is formed at an interface between the resin layer 103 and the oxide layer 101 by light irradiation. In addition, a metal oxide layer (not illustrated) is formed at an interface between the oxide layer 101 and the metal layers 102a and 102b, whereby separation is promoted later.

When heating is performed at 410° C. or higher in advance of the laser light irradiation, laser light irradiation for a region where the metal layers 102a and 102b are formed is not necessarily performed because the metal oxide layer is already formed.

When a tungsten layer and an oxide layer are formed, separation can be performed without laser light irradiation for that region depending on the conditions. Accordingly, an area where the tungsten layer is selectively formed is increased, an area irradiated with laser light can be reduced. The tungsten layer may be provided at a region overlapping with an element which is not required to be irradiated with laser light because the tungsten layer can function as a light-blocking layer. In this embodiment, the metal layer 102a overlaps with a semiconductor layer of the transistor 105 and the metal layer 102b overlaps with a semiconductor layer 108, whereby light emitted from the laser light source is blocked. The metal layer 102b may be in a floating state, have a fixed potential, or have the same potential as a gate of a transistor overlapping therewith. Note that when a polyimide resin is used as the resin layer 103, most of laser light is absorbed by the resin layer. Therefore, laser light rarely reaches elements when the resin layer is thick. When the resin layer is thin and there is a possibility that laser light reaches the elements, tungsten is effectively used for a light-blocking film.

When the entire surface of the substrate is irradiated with laser light, a time for laser light scanning is disadvantageously increased as the size of the substrate is increased. The use of tungsten for the light-blocking film can reduce the time for the laser light treatment; therefore, the separation method in this specification can achieve an advantageous effect.

Figure 1D:
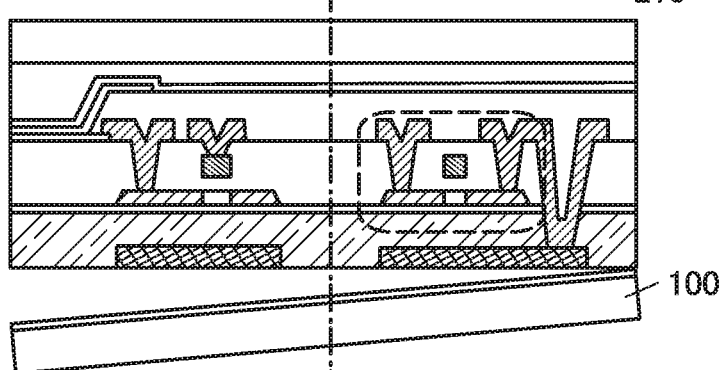

Next, the substrate 100 is separated at the interface between the oxide layer 101 and the resin layer 103 and at the interface between the oxide layer 101 and the metal layers 102a and 102b (see FIG. 1D). As a separation method, mechanical force (a separation process with a human hand or a gripper, a separation process by rotation of a roller, ultrasonic waves, or the like) may be used.

Figure 3A:
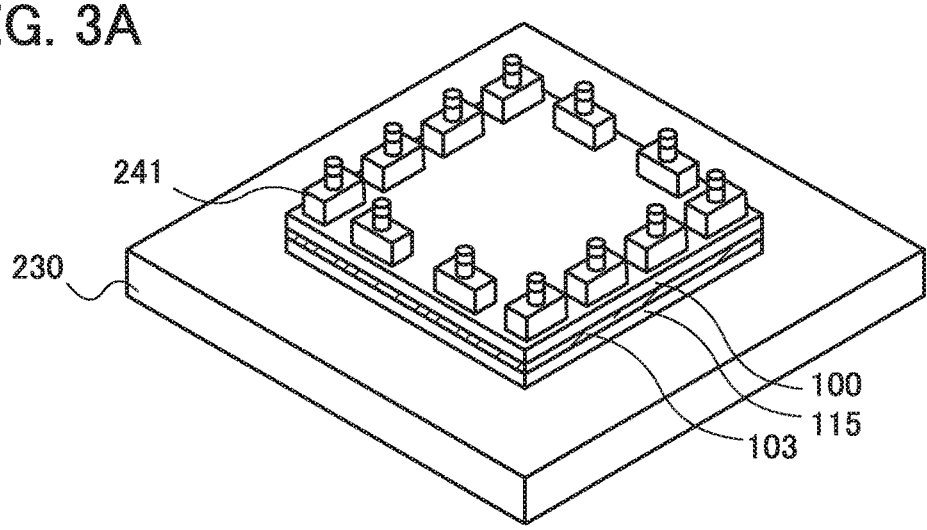
FIGS. 3A to 3C are perspective views of a separation apparatus, illustrating one embodiment of the present invention.

FIG. 3A illustrates an example of an apparatus for separation. In FIG. 3A, the substrate 100 is provided over a fixing stage 230 so as to be in the uppermost position, and is fixed with a plurality of suction jigs 241. The suction jigs 241 each include a vertical movement mechanism and a suction portion.

The flexible film 115 is fixed in contact with a top surface of the fixing stage 230. As the fixing stage 230, a vacuum suction stage, or an electrostatic adsorption stage can be used, for example. Alternatively, the flexible film 115 may be fixed to the stage with a screwing jig or the like. At this time, the flexible film 115 is aligned and fixed in a predetermined position.

Figure 4A:
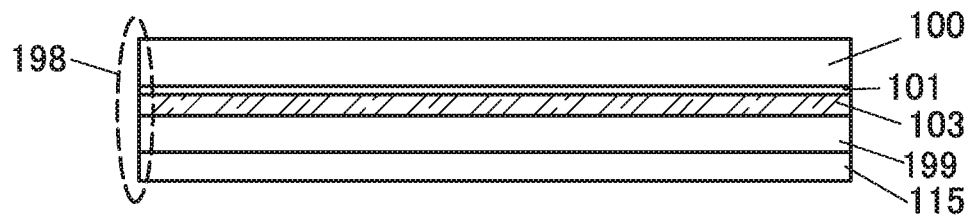
FIGS. 4A to 4C are cross-sectional schematic views of one embodiment of the present invention.
Figure 4B:
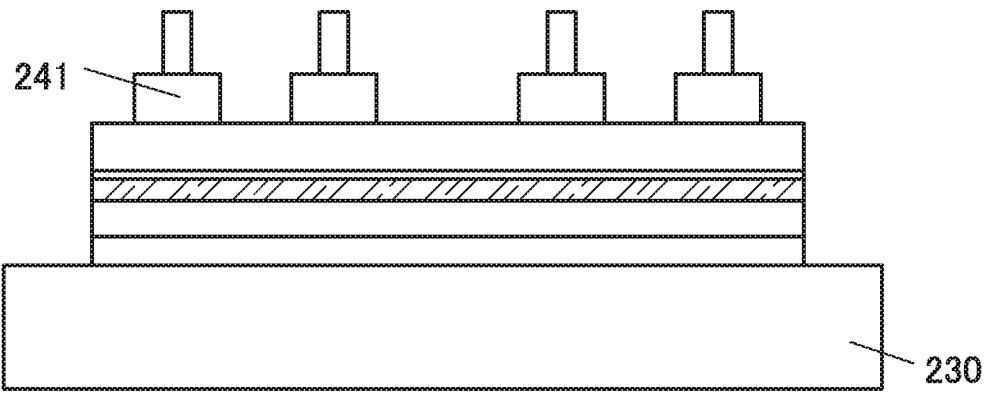
Figure 4C:
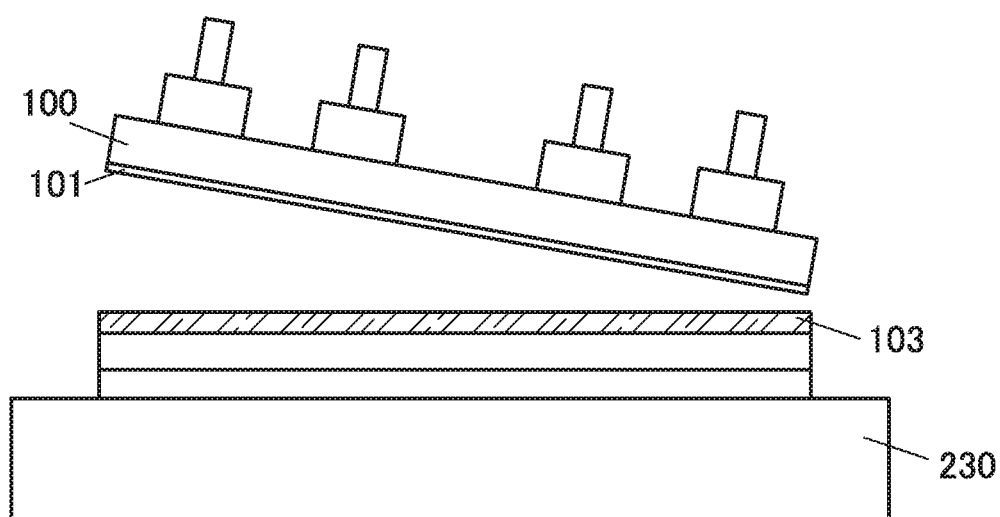

FIGS. 4A to 4C are examples of cross-sectional schematic views at the times when pretreatment of a separation process using suction jigs is performed and when the separation process is performed.

Figure 3B:
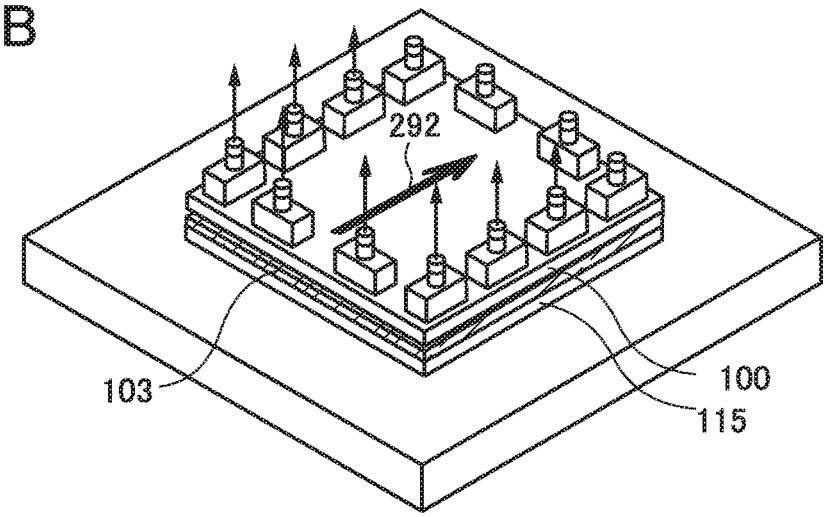
Figure 3C:
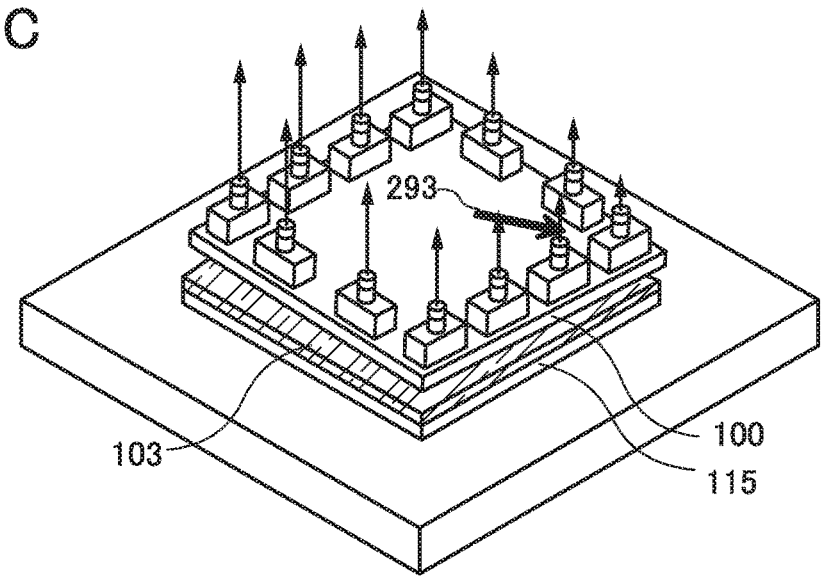

A process member preferably has a separation trigger on its side surface 198 before being set on the separation apparatus illustrated in FIGS. 3A to 3C. This separation trigger can be formed by cutting treatment, polishing treatment, laser light treatment, plasma treatment, partial etching treatment using a chemical solution such as an organic solvent or an etchant, for example. For the plasma treatment, a plasma treatment apparatus having a mechanism for generating plasma at a pressure near atmospheric pressure is used.

FIG. 4A illustrates a stack as the process member which includes the substrate 100, the oxide layer 101, the resin layer 103, the layer 199 including elements, and the flexible film 115, and side surface treatment is subjected to the side surface 198. Note that the pretreatment of the separation process is performed to improve the yield and is not necessarily performed.

After the side surface treatment is performed, the suction jigs 241 are made to be in contact with the substrate 100 to fix the substrate 100. In addition, the flexible film 115 is fixed in contact with the fixing stage 230. FIG. 4B illustrates this state. A perspective view illustrating the process member that is set in the separation apparatus corresponds to FIG. 3A.

Then, one or some of the suction jigs 241, which are the nearest to the portion subjected to the side surface treatment, are picked up to cause separation. A perspective view illustrating the separation being performed corresponds to FIG. 3B. The separation is started in the direction of an arrow 292, and then continued in the direction of an arrow 293 illustrated in FIG. 3C by tilting the surface of the substrate 100.

FIG. 4C illustrates a state in which the separation is completed.

The peripheral portion of the substrate may be cut before the separation or the light irradiation so that the resin layer on the peripheral portion of the substrate is removed. The resin layer sometimes adheres to the bottom surface of the substrate in addition to its side surface in the peripheral portion of the substrate. When the cutting is performed, separation can be smoothly performed if started from the cut portion.

When the metal layer that is formed using tungsten as described in this embodiment has a thickness of greater than or equal to 150 nm, separation can be performed between the oxide layer 101 and the metal layer. In the case where the thickness of the metal layer formed using tungsten is less than 150 nm, the oxide layer 101 and the metal layer are hardly separated from each other and separation is possibly performed from the top surface side of the metal layer.

Figure 1E:
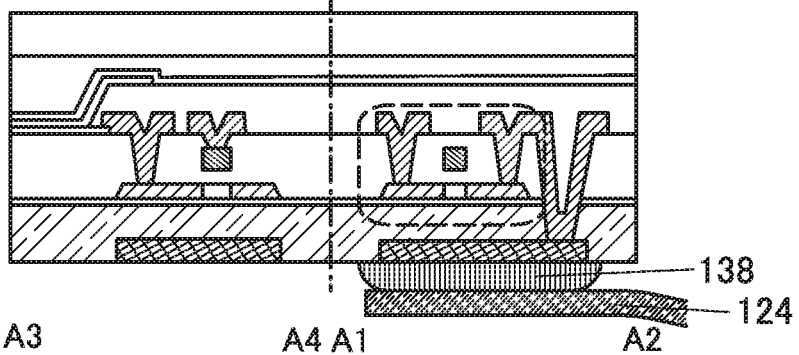

Next, an anisotropic conductive connection layer 138 is formed, and the external electrode 124 for inputting electric power or a signal to the display device is formed over the anisotropic conductive connection layer 138 (see FIG. 1E). The external electrode 124 is electrically connected to the metal layer 102a through the anisotropic conductive connection layer 138. Consequently, electric power or a signal can be input to the display device. Note that an FPC can be used as the external electrode 124. A metal wire can also be used as the external electrode 124. Although the anisotropic conductive connection layer 138 may be used to connect the metal wire and the metal layer 102a to each other, the connection can be made by a wire bonding method without using the anisotropic conductive connection layer 138. Alternatively, the metal wire and the metal layer 102a may be connected to each other by a soldering method.

The anisotropic conductive connection layer 138 can be formed using any of various kinds of anisotropic conductive films (ACF), anisotropic conductive pastes (ACP), and the like.

The anisotropic conductive connection layer 138 is formed by curing a paste-form or sheet-form material that is obtained by mixing conductive particles to a thermosetting resin or a thermosetting and light curable resin. The anisotropic conductive connection layer 138 exhibits an anisotropic conductive property by light irradiation or thermocompression bonding. As the conductive particles used for the anisotropic conductive connection layer 138, for example, particles of a spherical organic resin coated with a thin-film metal such as Au, Ni, or Co can be used.

Although FIG. 1E illustrates the metal layer 102b that is not covered, there is no limitation. A protective film may be attached using an adhesive layer to protect the metal layer 102b from static electricity or the like. The metal layer 102b in a floating state becomes unnecessary after performing a function of blocking light at the time of laser light irradiation. Thus, the metal layer 102b may be separated together with the glass substrate at the time of separation. Although a depressed portion is formed on the resin layer in this case, there is no particular problem. In contrast, the metal layer 102a is connected to the upper-layer wiring through an opening of the resin layer, and therefore is fixed to the resin layer firmly enough. In order to fix the metal layer 102a more firmly, it is preferable that the number of openings of the resin layer be increased or the area of the opening be increased so that the area that is in contact with the upper-layer wiring is increased.

Figure 2:
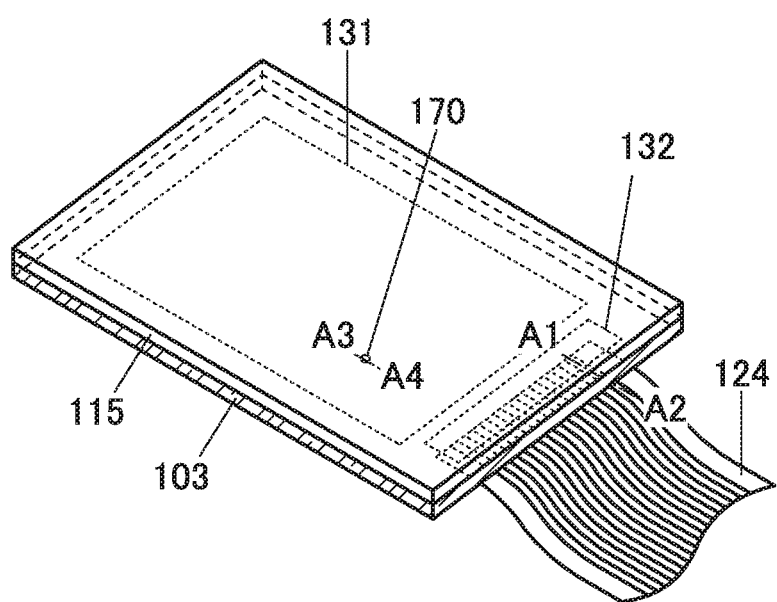
FIG. 2 is a perspective view of a display module, illustrating one embodiment of the present invention.

FIG. 2 is a perspective view of a display module obtained through the above manufacturing process.

FIG. 2 illustrates a display module placed between the resin layer 103 and the flexible film 115. In this embodiment, a surface where the flexible film 115 is provided corresponds to its display surface so that a top-emission structure is employed. The display module includes the display region 131 and the peripheral circuit 132, and the display region 131 includes a plurality of pixels 170. Each of the pixels 170 includes at least one light-emitting element. A plurality of light-emitting elements are formed in the display region 131. A transistor for controlling the amount of light emitted from the light-emitting element is connected to each light-emitting element.

The peripheral circuit 132 includes a plurality of the transistors 105. The peripheral circuit 132 has a function of determining which of the light-emitting elements in the display region 131 is supplied with a signal from the external electrode 124.

The metal layer 102a is provided in a region partly overlapping with the peripheral circuit 132 and is electrically connected to the external electrode 124, whereby an area to be a frame can be reduced.

This embodiment can be implemented in appropriate combinations with the configurations described in the other embodiments.

Embodiment 2

The separation apparatus of one embodiment of the present invention is described with reference to FIG. 5 and FIG. 6.

In this embodiment, an example in which the first member 72 and the second member 71 are separated from each other by separating the first member 72 from the process member 70 is described. Note that the first member 72 and the second member 71 may be separated from each other by separating the second member 71 from the process member 70.

The process member 70 has a sheet-like shape and includes the sheet-like first member 72 and the sheet-like second member 71. The first member 72 and the second member 71 may each have a single-layer structure or a stacked-layer structure. In this embodiment, the first member 72 is a glass substrate and an oxide layer formed over the surface of the glass substrate. The second member 71 is a separation layer including a transistor and a flexible film.

The process member 70 preferably has a separation trigger formed by a side surface treatment or a cutting treatment before being set on the conveyor roller. In the cutting treatment, the process member 70, mainly part of the glass substrate, is cut with a cutter or a dicer so as to have a size suitable for processing which corresponds to a separation apparatus. In the side surface treatment, the resin layer or the like on the side surface of the process member is embrittled or removed by polishing for the side surface of the process member with a substrate side surface treatment unit, light irradiation with a carbon dioxide gas laser (the central wavelength is approximately 10.6 μm), light irradiation with a femtosecond laser (the central wavelength is approximately 800 nm), ultrasonic wave irradiation, plasma irradiation, or the like. The treatment facilitates the separation at the interface between the first member 72 and the second member 71. The second member 71 includes at least one of a functional circuit, a functional element, and a functional film, for example. For example, the second member 71 can include at least one of a pixel circuit, a pixel driver circuit, a display element, a color filter, and a moisture-proof film of a display device.

Figure 5:
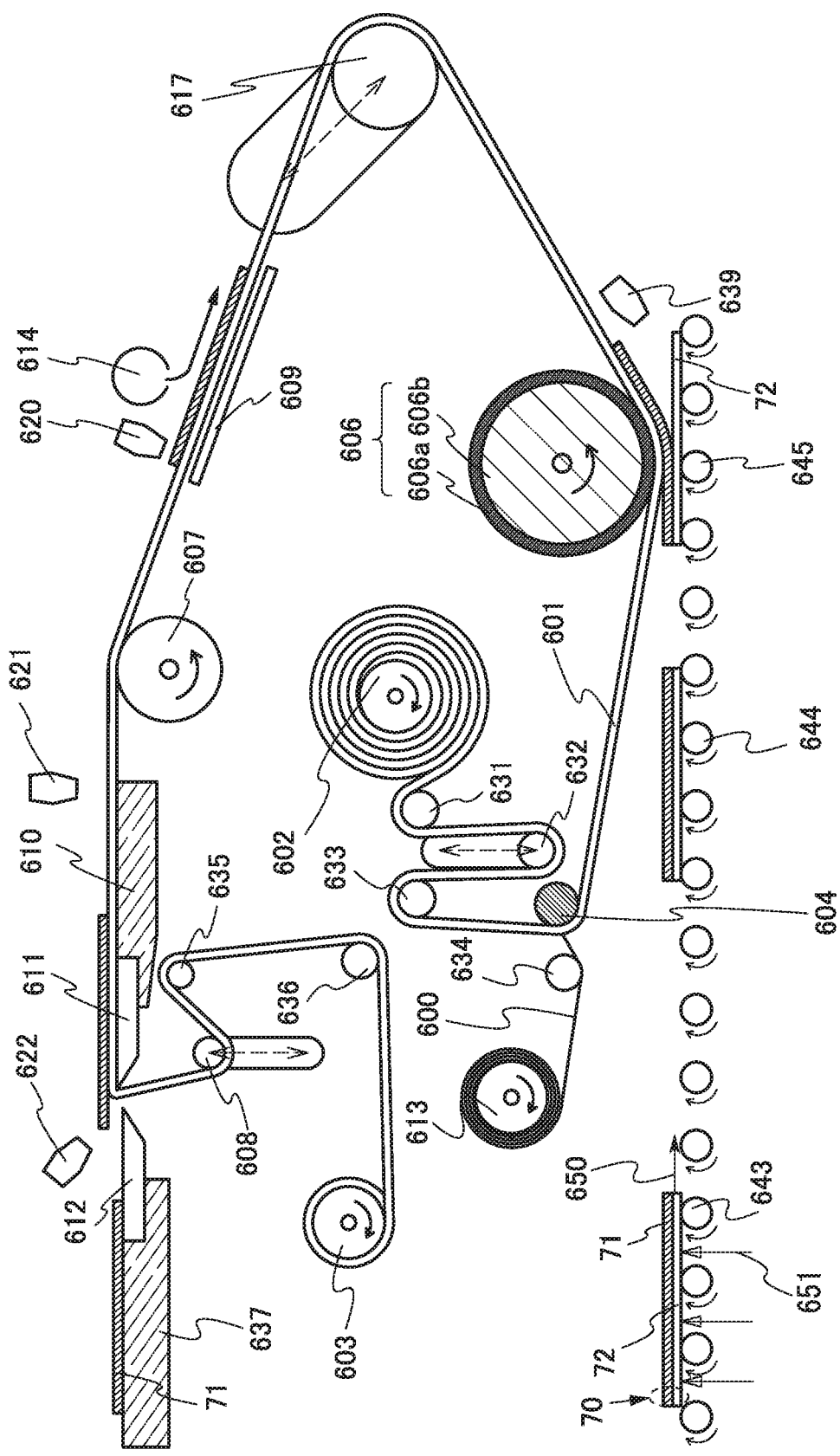
FIG. 5 is a cross-sectional schematic view of a separation apparatus of one embodiment of the present invention.

The separation apparatus in FIG. 5 includes a plurality of conveyor rollers (e.g., conveyor rollers 643, 644, and 645), a mechanism for emitting laser light 651 through openings between the plurality of conveyor rollers (a light irradiation unit), a tape reel 602, a first wind-up reel 603, a direction changing roller 604, and a press roller 606.

In a mechanism in which irradiation of the laser light 651 is performed through openings between the plurality of conveyor rollers, a feed direction 650 of the process member 70 is the scanning direction of laser light; therefore, the feed speed is preferably controlled by controlling the rotational speed of the conveyor roller. Note that FIG. 6 illustrates an example of the mechanism for irradiation of the laser light 651. In the perspective view in FIG. 6, the process member 70 is irradiated with the laser light 651 through openings between the plurality of conveyor rollers from the laser light source 655. A lens 652, a mirror 653, and an optical system 654 are placed so that the laser beam is focused on the interface between the first member 72 and the second member 71 and the laser light irradiation region becomes linear, rectangular, or elliptical at the interface. In this embodiment, the laser light irradiation region has a length of greater than or equal to 20 cm and less than or equal to 1 m. Laser light irradiation is performed intermittently or continuously depending on the scanning speed of the conveyor roller 643, and the interface between the first member 72 and the second member 71 is ablated to form a separation trigger.

Figure 6:
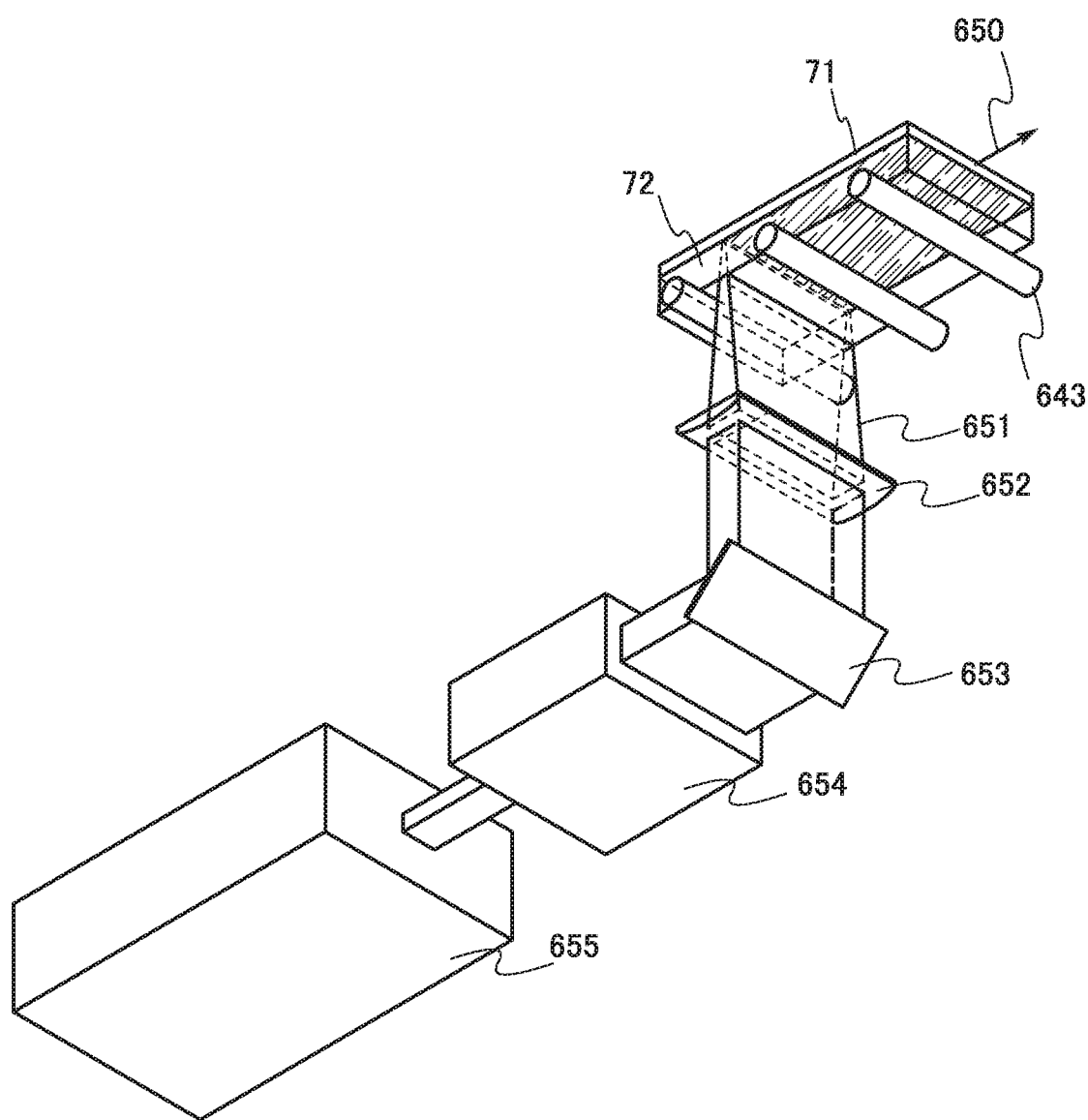
FIG. 6 is a perspective view illustrating part of a separation apparatus of one embodiment of the present invention.

In addition, in the mechanism that performs irradiation of the laser light 651 as illustrated in FIG. 6, the side surface of the process member 70 is irradiated. Accordingly, the above described side surface treatment can be concurrently performed by the laser light 651, and the mechanism can also be called a substrate side surface treatment unit.

Although the number of the laser light sources 655 is one in FIG. 6, a plurality of laser light sources may be provided depending on the area of the process member 70, specifically the size of the glass substrate, and a plurality of the laser light irradiation regions may be arranged in a row. As the size of the glass substrate, the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); the tenth generation (2880 mm×3130 mm), or the like can be given. A large-sized glass substrate is sometimes difficult to perform minute processing because the substrate is shrunk by heat treatment or the like in the process for manufacturing a semiconductor device. Therefore, when such a large-sized glass substrate is used as the substrate, the one with a small shrinkage is preferably used. For example, the substrate can be a large-sized glass substrate having an amount of shrinkage of less than or equal to 20 ppm, preferably less than or equal to 10 ppm, further preferably less than or equal to 5 ppm, which is measured after heat treatment is performed for one hour at preferably 450° C., further preferably 500° C. In addition, a large-sized glass substrate (e.g., the tenth generation glass substrate) is preferably divided in advance of laser light irradiation, and then carried to the mechanism in which irradiation of the laser light 651 is performed.

The tape reel 602 is an example of the support body supply unit. The tape reel 602 can feed a support body 601 in rolled sheet form. The speed at which the support body 601 is fed is preferably adjustable. When the speed is set relatively low, for example, failure in separation of the process member or a crack in a separated member can be inhibited.

The support body supply unit may feed the support body 601 continuously. The support body 601 can be fed continuously when there is no need of stopping feeding the support body 601 during the process. It is preferable to feed the support body 601 continuously because separation can be performed at a uniform speed and with a uniform force. Note that in the separation process, the separation is preferably performed successively without being stopped, and is further preferably performed with constant velocity. When the separation stops in the middle of the process and then resumes from the same region, distortion or the like occurs in the region, unlike in the case of successive separation. Thus, a minute structure of the region or the characteristics of an electronic device or the like located on the region are changed, which might influence display of a display device, for example.

The support body supply unit may feed the support body 601 intermittently. The support body 601 may be fed intermittently in the case where feeding of the support body 601 needs to be stopped during the process. Note that at least during separation, the support body 601 is preferably fed continuously for a higher yield of separation.

As the support body 601, a film in rolled sheet form made of an organic resin, a metal, an alloy, glass, or the like can be used.

The support body 601 may be a member that is not a constituent of the device to be manufactured (e.g., flexible device), such as a carrier tape. The flexible device means a device including a flexible film substrate, for example, a device part of which is bendable or a device part of which is kept bent. Alternatively, the support body 601 may be a flexible substrate or the like, which is a member that is a constituent of the device to be manufactured, like the second member 71.

The support body hold unit can wind up the support body 601, can wind up the support body 601 and the second member 71, or can hold an end portion of the support body 601, for example. The first wind-up reel 603 is an example of the support body hold unit. The first wind-up reel 603 can wind up the support body 601.

The tape reel 602 includes one of a pair of tension applying mechanisms. The first wind-up reel 603 includes the other of the pair of tension applying mechanisms. The pair of tension applying mechanisms can apply tension to the support body 601.

The plurality of conveyor rollers are an example of the conveying mechanism. The plurality of conveyor rollers can convey the process member 70. The mechanism for conveying the process member 70 is not limited to the conveyor roller and may be a different conveying mechanism such as a belt conveyor or a conveying robot. Alternatively, the process member 70 may be placed over a stage over the conveying mechanism.

The conveyor roller 643, the conveyor roller 644, and the conveyor roller 645, each of which is one of the conveyor rollers that are lined up, are provided at predetermined intervals and rotate in the direction in which the process member 70 (or the second member 71) is fed (the clockwise direction as indicated by solid arrows). The plurality of lined-up conveyor rollers are each rotated by a driving portion (e.g., a motor), which is not illustrated.

The direction changing roller 604 is an example of a direction changing mechanism. The direction changing roller 604 can change the feed direction of the support body 601.

The support body 601 is bonded to the second member 71 by the press roller 606 and the conveyor roller 645.

In FIG. 5, the bottom edge of the direction changing roller 604 is located at a higher level than that of the bottom edge of the press roller 606. Here, when at least part of the process member 70 is positioned between the direction changing roller 604 and the press roller 606, a plane including a surface of the second member 71 is called a first plane. With the first plane taken into consideration, the shortest distance between the first plane and the direction changing roller 604 is longer than the shortest distance between the first plane and the press roller 606.

Such a structure can prevent the support body 601 from being in contact with the second member 71 before reaching the press roller 606. Accordingly, air bubbles can be inhibited from being trapped between the support body 601 and the process member 70.

The press roller 606 is an example of the first structure body having a convex surface. The press roller 606 is rotated by a driving portion (e.g., a motor) which is not illustrated.

When the press roller 606 rotates, the force of peeling the first member 72 is applied to the process member 70; thus, the first member 72 is peeled. At this time, the process member 70 has been irradiated with the laser light 651 and has a separation trigger, so that smooth separation is performed. Separation of the first member 72 starts from the separation trigger, that is, from the side surface of the process member 70. As a result, the process member 70 is divided into the first member 72 and the second member 71.

The mechanism for separating the first member 72 from the process member 70 is not limited to the press roller 606, and a structure body having a convex surface (or a convex curved surface) is applicable. For example, a cylindrical (e.g., circular cylindrical, right circular cylindrical, elliptic cylindrical, or parabolic cylindrical) or spherical structure body can be used. Furthermore, a roller such as a drum type roller can be used, for example. Examples of the shape of the structure body include a column with a bottom surface whose boundary includes a curved line (e.g., a cylinder with a perfect circle-shaped bottom surface or an elliptic cylinder with an ellipse-shaped bottom surface), and a column with a bottom surface whose boundary includes a curved line and a straight line (e.g., a column with a semicircular bottom surface or a semi-elliptical bottom surface). If the shape of the structure body is any of such columns, the convex surface corresponds to a curved surface of the column.

As a material of the first structure body, a metal, an alloy, an organic resin, rubber, or the like can be used. The first structure body may have a space or a hollow inside. Examples of the rubber include natural rubber, urethane rubber, nitrile rubber, and neoprene rubber. In the case of using rubber, it is preferable to use a material unlikely to be charged by friction or separation or to take countermeasures to prevent static electricity. The press roller 606 illustrated in FIG. 5 includes, for example, a hollow cylinder 606a made of rubber or an organic resin and a cylindrical column 606b made of a metal or an alloy and located inside the cylinder 606a.

For example, the convex surface of the first structure body can have a radius of curvature of greater than or equal to 0.5 mm and less than or equal to 3000 mm. In the case where a film is separated, for example, the radius of curvature of the convex surface can be greater than or equal to 0.5 mm and less than or equal to 1000 mm, and specifically can be 150 mm, 225 mm, or 300 mm. As an example of the structure body having such a convex surface, a roller with a diameter of 300 mm, 450 mm, or 600 mm can be given. Note that a preferred radius of curvature of the convex surface depends on the thickness or the size of a process member.

When the radius of curvature of the convex surface is too small, an element included in the second member 71 which is peeled along the convex surface might be broken. For this reason, the radius of curvature of the convex surface is preferably greater than or equal to 0.5 mm.

When the radius of curvature of the convex surface is large, a substrate of glass, sapphire, quartz, silicon, or the like, which has low flexibility and high stiffness, can be peeled along the convex surface. For this reason, the radius of curvature of the convex surface is preferably greater than or equal to 300 mm, for example.

When the radius of curvature of the convex surface is too large, the size of the separation apparatus might be increased, which might limit the installation location. For this reason, the radius of curvature of the convex surface is preferably less than or equal to 3000 mm, further preferably less than or equal to 1000 mm, still further preferably less than or equal to 500 mm, for example.

A larger radius of curvature of the convex surface is preferable because the angle α at which the press roller 606 bends back the support body 601 can be more easily made large. For this reason, the radius of curvature of the convex surface is preferably greater than or equal to 300 mm, for example.

The rotation speed of the press roller 606 is preferably adjustable. By adjusting the rotation speed of the press roller 606, the yield of separation can be further increased.

The press roller 606 and the plurality of conveyor rollers may be movable in at least one direction (e.g., upward and downward, rightward and leftward, or forward and backward). The distance between the convex surface of the press roller 606 and a supporting surface of the conveyor roller is preferably adjustable because separation can be performed on process members with various thicknesses.

FIG. 5 illustrates an example in which the angle α at which the press roller 606 bends back the support body 601 is an obtuse angle.

The roller 617 is an example of the second structure body with a convex surface. The radius of curvature of the convex surface included in the roller 617 can be, for example, less than or equal to the radius of curvature of the convex surface included in the press roller 606, and preferably less than the radius of curvature of the convex surface included in the press roller 606. The roller 617 can feed the support body 601 from the press roller 606 to the first wind-up reel 603 along the convex surface.

The roller 617 can apply tension to the support body 601 by moving the shaft of the roller 617. That is, the roller 617 can also be referred to as a tension roller. Specifically, the roller 617 can pull the support body 601 in the feed direction changed with the press roller 606.

Moving the shaft of the roller 617 enables the roller 617 to control the angle α at which the press roller 606 bends back the support body 601.

Note that the roller 617 may be movable only in one direction as illustrated in FIG. 5; alternatively, no roller 617 may be provided.

The roller 617 can bend back the support body 601 to change the feed direction of the support body 601. For example, the feed direction of the support body 601 may be changed to the horizontal direction. Alternatively, the following structure may be employed: the roller 617 bends back the support body 601 to change the feed direction of the support body 601; then, the feed direction of the support body 601 is further changed to the horizontal direction by a direction changing roller 607 (FIG. 5) located between the roller 617 and the first wind-up reel 603.

The diameters of the direction changing roller 604 and the roller 617 are not limited and, for example, may be smaller than the diameter of the first press roller 606. Materials that can be used for the press roller 606 can be used for each of the direction changing roller 604 and the roller 617.

The separation apparatus may include a guide roller for guiding the support body 601 to the first wind-up reel 603. One guide roller may be provided, or a plurality of guide rollers may be provided. Like a guide roller 632 illustrated in FIG. 5, the guide roller may be capable of applying tension to the support body 601.

The separation tape 600 (also called separate film) may be bonded to at least one surface of the support body 601. In this case, the separation apparatus preferably includes a reel that can wind up the separation tape 600 bonded to one surface of the support body 601. The reel is located between the support body supply unit and the support body hold unit. Furthermore, the separation apparatus may include a guide roller 634. The guide roller 634 can guide the separation tape 600 to a second wind-up reel 613.

The separation apparatus may include a drying mechanism 614. Since the functional element (e.g., a transistor or a thin-film integrated circuit) included in the second member 71 is vulnerable to static electricity, it is preferable that liquid be supplied to the interface between the first member 72 and the second member 71 before separation or that the separation be performed while liquid is supplied to the interface. Since watermarks might be formed if the liquid adhered to the second member 71 is vaporized, the liquid is preferably removed immediately after the separation. Thus, immediately after separated from the first member 72, the second member 71 including a functional element is preferably blow-dried to remove a droplet left on the second member 71. Therefore, generation of watermarks can be suppressed. A carrier plate 609 may be provided to prevent slack in the support body 601.

Although the feed direction of the support body 601 may be perpendicular to the horizontal plane, the feed direction is preferably tilted relative to the horizontal plane for higher stability and less shaking of the support body 601 being fed.

During the process, a static eliminator included in the separation apparatus is preferably used at a position where static electricity might be generated. There is no particular limitation on the static eliminator, and for example, a corona discharge ionizer, a soft X-ray ionizer, an ultraviolet ionizer, or the like can be used.

For example, it is preferable that the separation apparatus be provided with an ionizer and static elimination be performed by spraying the second member 71 with air, a nitrogen gas, or the like from the ionizer to reduce adverse effects of static electricity on the functional element. It is particularly preferable to use the ionizer in a step of bonding two members to each other and a step of dividing one member. The separation apparatus illustrated in FIG. 5 includes an ionizer 639, an ionizer 620, an ionizer 621, and an ionizer 622.

For example, the process member 70 is preferably divided into the first member 72 and the second member 71 while the vicinity of the interface between the first member 72 and the second member 71 is irradiated with ions using the ionizer 639 to remove static electricity.

The separation apparatus may include a substrate load cassette and a substrate unload cassette. For example, the process member 70 can be supplied to the substrate load cassette. The substrate load cassette can supply the process member 70 to the conveying mechanism or the like. The second member 71 can be supplied to the substrate unload cassette.

The process member 70 may be conveyed from the substrate load cassette onto the guide roller with the conveying mechanism of the separation apparatus. The second member 71 over the guide roller may be conveyed to the substrate unload cassette with the conveying mechanism. In the case where the separation apparatus is connected to a different apparatus, the process member 70 may be conveyed from the different apparatus onto the guide roller with the conveying mechanism. In other words, the separation apparatus does not necessarily include the substrate load cassette. The second member 71 over the guide roller may be conveyed to a different apparatus with the conveying mechanism. In other words, the separation apparatus does not necessarily include the substrate unload cassette.

In the separation apparatus of one embodiment of the present invention, the conveyor rollers such as the conveyor rollers 643, 644, and 645, the press roller 606, and the like are driving rollers rotated by an electric motor or the like. The rotation speed of the tape reel 602 and that of the first wind-up reel 603 are also adjusted with a motor. These driving rollers, the tape reel 602, and the first wind-up reel 603 adjust the moving speed and tension of the support body 601. For example, a guide roller 631, the guide roller 632, a guide roller 633, the guide roller 634, a guide roller 635, and a guide roller 636, the direction changing roller 604, and a tension roller 608 are driven rollers. Note that in one embodiment of the present invention, whether each roller is a driving roller or a driven roller is not limited to the above and can be determined as appropriate. The roller 617 may be a driving roller or a driven roller. There is no particular limitation on the number of each kind of roller included in the separation apparatus of one embodiment of the present invention.

In the separation apparatus of one embodiment of the present invention, the first member is separated from the second member in such a manner that a support body is bonded to a process member and the support body is pulled, as described above. Since the process member can be automatically divided with the use of the support body, the processing time can be shortened and the manufacturing yield of products can be improved.

For example, the process member has a structure in which a formation substrate and a functional layer are stacked in this order. The functional layer corresponds to the second member and the formation substrate corresponds to the first member. Here, the support body may be used as a support body of the functional layer. In other words, the support body is not necessarily separated from the second member. A flexible substrate is bonded to the functional layer exposed by being separated from the formation substrate with the use of an adhesive, whereby a flexible device in which the support body, the functional layer, and the flexible substrate are stacked in this order can be manufactured.

Alternatively, the process member has a structure in which a formation substrate, a functional layer, and a flexible substrate are stacked in this order, for example. The functional layer and the flexible substrate correspond to the second member and the formation substrate corresponds to the first member. Since the support body bonded to the flexible substrate is unnecessary after separation, the support body is peeled from the second member. Another flexible substrate is bonded to the functional layer exposed by being separated from the formation substrate with the use of an adhesive, whereby a flexible device in which the flexible substrate, the functional layer, and the flexible substrate are stacked in this order can be manufactured.

Here, when force is applied to the support body for separation of the support body, failure in separation or a crack in the second member might occur depending on the feed speed, feed direction, or the like of the support body.

A structure described below makes it possible to automatically separate the support body and the first member, which enables reduction in the processing time and improvement of the manufacturing yield of the products in the separation apparatus of one embodiment of the present invention.

The separation apparatus in FIG. 5 includes the tension roller 608 and the guide roller 635.

The guide roller 635 guides the support body 601 to the first wind-up reel 603.

The tension roller 608 is located between the roller 617 and the first wind-up reel 603. The tension roller 608 can apply tension in the direction in which the support body 601 is bent back.

As a roller for guiding the support body 601 to the first wind-up reel 603, at least one of the guide roller 635 and the tension roller 608 is preferably provided.

A first wedge-shaped member 611 is preferably provided in a position where the support body 601 is bent back with the guide roller 635 or the tension roller 608. The first wedge-shaped member 611 may be fixed to the carrier plate 610. The first wedge-shaped member 611 has a tapered portion. The angle formed by a flat surface of the carrier plate 610 and the tapered portion of the first wedge-shaped member 611 determines the direction in which the support body 601 is bent back.

The angle of the direction in which the support body 601 is bent back is preferably, but not limited to, an acute angle to facilitate separation of the first member 72 from the support body 601.

A second wedge-shaped member 612 is fixed to a table 637. The first wind-up reel 603 can wind up the support body 601 that has passed between the first wedge-shaped member 611 and the second wedge-shaped member 612.

The table 637 has a flat surface. The second member 71 separated from the support body 601 is placed on the flat surface.

The flat surface of the carrier plate 610 is preferably positioned at a higher level than the flat surface of the table 637. In other words, the flat surface of the carrier plate 610 and the flat surface of the table 637 are not on the same plane and are located at different levels in cross section. As long as the flat surfaces are located at different levels, the first wedge-shaped member 611 and the second wedge-shaped member 612 may overlap with each other or do not necessarily overlap with each other when seen from above. In the case where the first wedge-shaped member 611 and the second wedge-shaped member 612 overlap with each other, a tip of the second wedge-shaped member 612 is located below the first wedge-shaped member 611.

In this manner, with the use of the separation apparatus of one embodiment of the present invention, the process member can be divided into the first member and the second member with a high yield. The separation apparatus of one embodiment of the present invention does not require a complicated structure and can be used for the separation of process members with a variety of sizes.

Separation can be performed by a worker manually but in that case, experience is required for a high speed and a high yield of separation. Thus, automation using the separation apparatus of one embodiment of the present invention is important. When separation of a process member is automated with the separation apparatus of one embodiment of the present invention, conveying and separation of the process member at a certain speed and separation with uniform force can be performed, which can inhibit failure of separation and crack caused in a separated member.

Note that one embodiment of the present invention is applicable to not only a separation apparatus but also a conveying apparatus or a bonding apparatus.

This embodiment can be combined with any of the other embodiments as appropriate.

Embodiment 3

In Embodiment 1, polycrystalline silicon is used as an example. In this embodiment, a display device is manufactured with the use of a transistor formed using an oxide semiconductor. The field effect mobility of the transistor formed using an oxide semiconductor can be higher than that of a transistor formed using an amorphous silicon film; thus, a peripheral circuit can be formed. In addition, the transistor formed using an oxide semiconductor can be formed at lower process temperatures than that formed using a polycrystalline silicon film; therefore, the manufacturing cost can be reduced.

Figure 7:
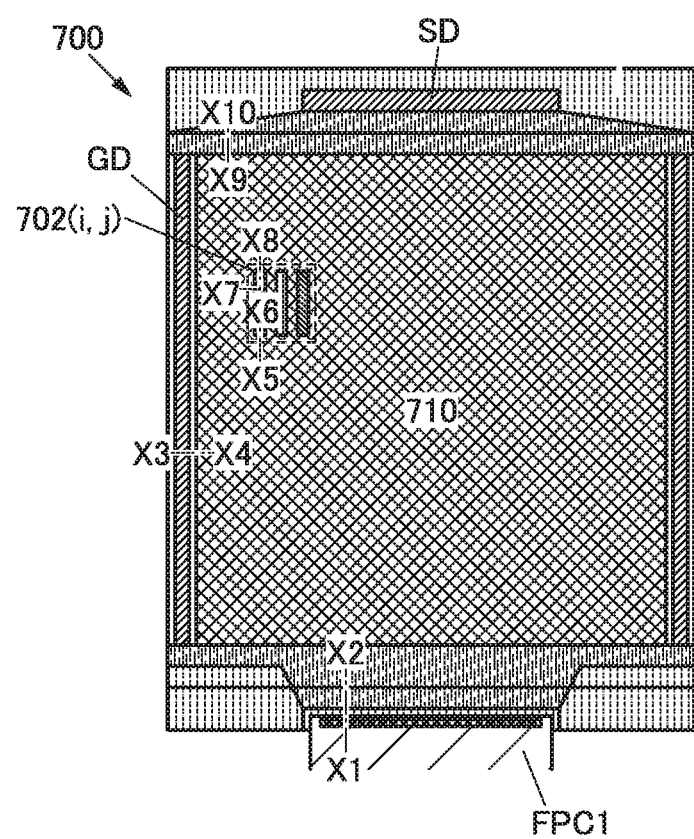
FIG. 7 illustrates a structure of a display panel of an embodiment.

FIG. 7 illustrates a structure of a display panel 700 of one embodiment of the present invention. FIG. 7 is a bottom view of the display panel 700 of one embodiment of the present invention.

Figure 8:
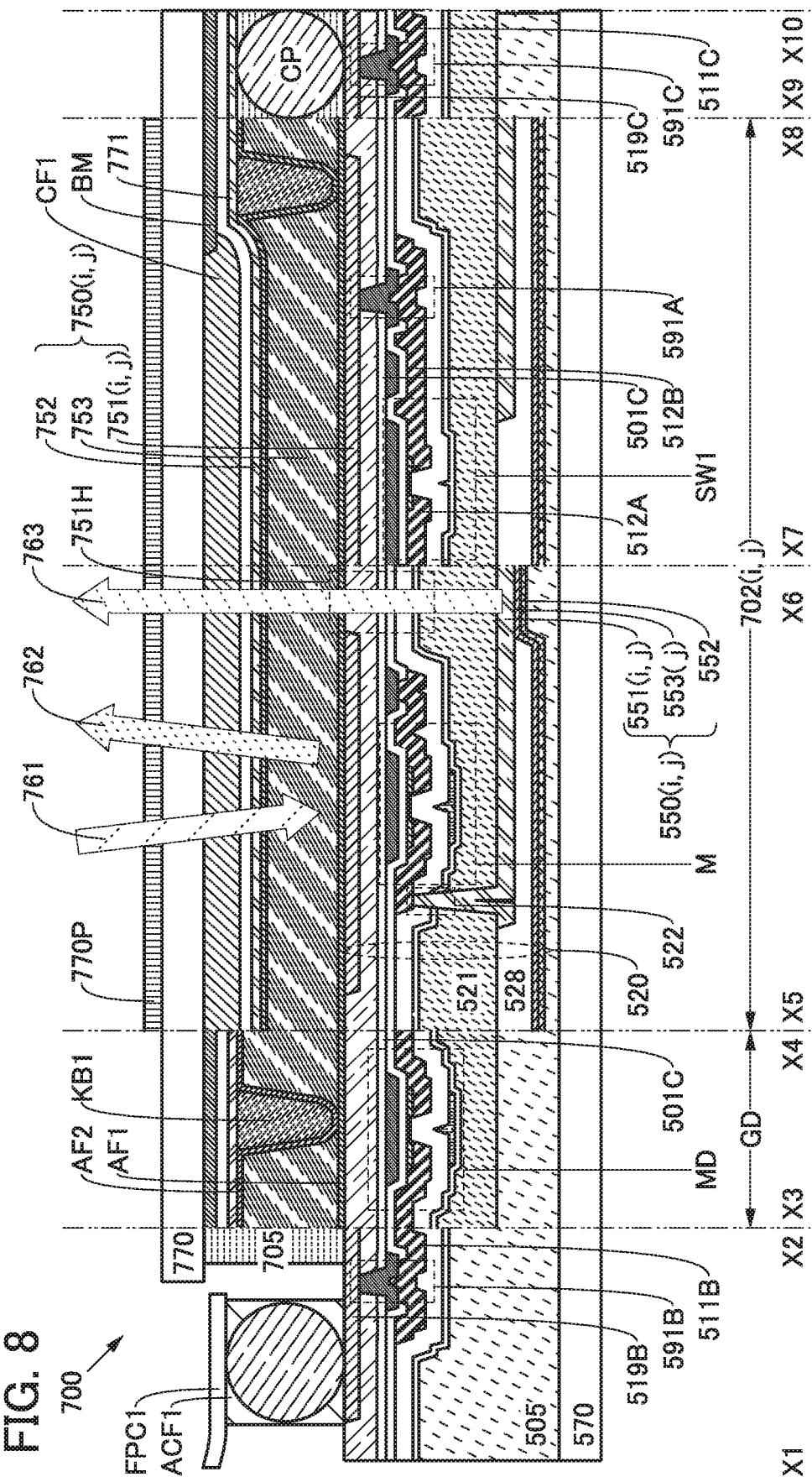
FIG. 8 illustrates a structure of a display panel of an embodiment.

FIG. 8 illustrates the structure of the display panel 700 of one embodiment of the present invention. FIG. 8 is a cross-sectional view taken along lines X1-X2, X3-X4, X5-X6, X7-X8, and X9-X10 in FIG. 7.

Figure 9:
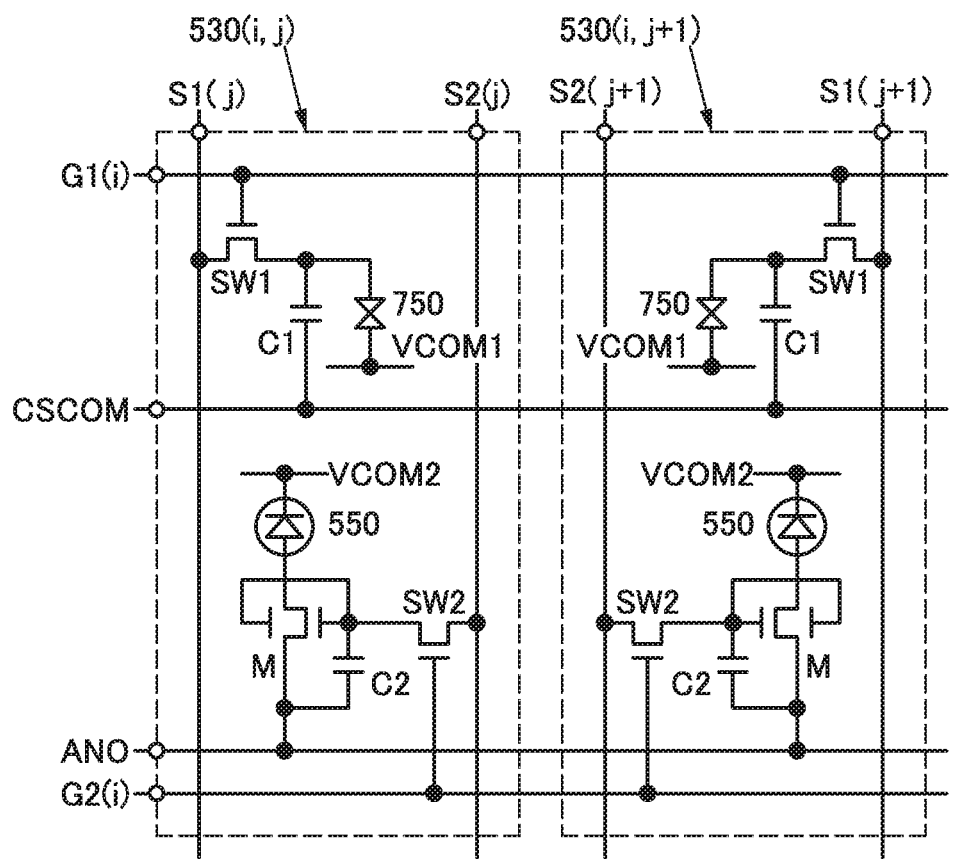
FIG. 9 is a circuit diagram illustrating a pixel circuit of an embodiment.

FIG. 9 illustrates the structure of the display panel 700 of one embodiment of the present invention. FIG. 9 is a circuit diagram illustrating a pixel circuit 530(i,j) and a pixel circuit 530(i,j+1) that can be used as pixel circuits included in the display panel 700 of one embodiment of the present invention.

FIGS. 10A, 10B1, and 10B2 illustrate the structure of the display panel 700 of one embodiment of the present invention. FIG. 10A is a block diagram illustrating the arrangement of pixels, wirings, and the like that can be used in the display panel 700 of one embodiment of the present invention. FIGS. 10B1 and 10B2 are schematic views illustrating the arrangement of openings 751H which can be used for the display panel 700 of one embodiment of the present invention.

The display panel in this embodiment includes a driver circuit GD, a driver circuit SD, and a display region 710 (see FIG. 7 and FIG. 10A). The display region 710 includes a pixel 702(i,j). The pixel 702(i,j) is electrically connected to the signal line S1(j). Note that although FIG. 7 illustrates the display panel 700 in which the display region 710 is rectangular, the display panel 700 can have a circular display region 710. In addition, the substrate of the display panel 700 of one embodiment of the present invention is a flexible film substrate, and is bendable along a portion between the driver circuit and the display region. A narrower frame can be achieved. The substrate bendable along the portion between the driver circuit and the display region is effective especially for a device having a small display region.

The pixel 702(i,j) includes a first display element 750(i,j), a first conductive film, a second conductive film, an insulating film 501C, the pixel circuit 530(i,j), and a second display element 550(i,j) (see FIG. 8 and FIG. 9).

The first conductive film is electrically connected to the first display element 750(i,j) (see FIG. 8). For example, the first conductive film can be used for a first electrode 751(i,j) of the first display element 750(i,j).

The second conductive film includes a region overlapping with the first conductive film. For example, the second conductive film can be used for a conductive film 512B serving as a source electrode or a drain electrode of a transistor that can be used for a switch SW1.

The insulating film 501C includes a region between the second conductive film and the first conductive film.

The pixel circuit 530(i,j) is electrically connected to the second conductive film. For example, the transistor in which the second conductive film is used as the conductive film 512B serving as a source electrode or a drain electrode can be used as the switch SW1 of the pixel circuit 530(i,j) (see FIG. 8 and FIG. 9).

The second display element 550(i,j) is electrically connected to the pixel circuit 530(i,j).

The insulating film 501C has an opening 591A (see FIG. 8).

The second conductive film is electrically connected to the first conductive film through the opening 591A. For example, the conductive film 512B is electrically connected to the first electrode 751($i,j$) which also serves as the first conductive film.

The pixel circuit 530($i,j$) is electrically connected to the signal line S1($j$) (see FIG. 9). Note that the conductive film 512A is electrically connected to the signal line S1($j$) (see FIG. 8 and FIG. 9).

The pixel circuit 530($i,j$) of the display panel in this embodiment includes the switch SW1. The switch SW1 includes a transistor that includes an oxide semiconductor.

The second display element 550($i,j$) of the display panel in this embodiment has a function of performing display in the same direction as the display direction of the first display element 750($i,j$). For example, in the drawing, an arrow 762 shows the direction in which the first display element 750($i,j$) displays images by controlling the intensity of external light reflection. In addition, an arrow 763 shows the direction in which the second display element 550($i,j$) displays images (see FIG. 8).

In addition, the second display element 550($i,j$) of the display panel in this embodiment has a function of displaying images in a region surrounded by a region in which the first display element 750($i,j$) displays images (see FIG. 10B1 or 10B2). Note that the first display element 750($i,j$) displays images in a region overlapping with the first electrode 751($i,j$), and the second display element 550($i,j$) displays images in a region overlapping with the opening 751H.

The first display element 750($i,j$) of the display panel in this embodiment includes a reflective film having a function of reflecting incident light and has a function of controlling the intensity of reflected light. The reflective film has the opening 751H. Note that for example, the first conductive film, the first electrode 751($i,j$), or the like can be used as the reflective film of the first display element 750($i,j$).

The second display element 550($i,j$) has a function of emitting light toward the opening 751H.

The display panel in this embodiment includes the pixel 702($i,j$), a group of pixels 702($i,1$) to 702($i,n$), another group of pixels 702($1,j$) to 702($m,j$), and a scan line G1($i$) (see FIG. 10A). Note that i is an integer greater than or equal to 1 and less than or equal to m, j is an integer greater than or equal to 1 and less than or equal to n, and each of m and n is an integer greater than or equal to 1.

The display panel in this embodiment also includes a scan line G2($i$), a wiring CSCOM, and a wiring ANO.

The group of pixels 702($i,1$) to 702($i,n$) include the pixel 702($i,j$) and are arranged in the row direction (the direction shown by the arrow R in drawings).

The other group of pixels 702($1,j$) to 702($m,j$) include the pixel 702($i,j$) and are arranged in the column direction (the direction shown by the arrow C in drawings) intersecting the row direction.

The scan line G1($i$) is electrically connected to the group of pixels 702($i,1$) to 702($i,n$) arranged in the row direction.

The group of pixels 702($1,j$) to 702($m,j$) arranged in the column direction are electrically connected to the signal line S1($j$).

For example, the pixel 702($i,j+1$) adjacent to the pixel 702($i,j$) in the row direction includes an opening in a position different from that of the opening 751H in the pixel 702($i,j+1$) (see FIG. 10B1).

For example, the pixel 702($i+1,j$) adjacent to the pixel 702($i,j$) in the column direction has an opening in a position different from that of the opening 751H in the pixel 702($i,j$) (see FIG. 10B2). Note that for example, the first electrode 751($i,j$) can be used for the reflective film.

In addition, the display panel in this embodiment includes a terminal 519B and a conductive film 511B (see FIG. 8).

The insulating film 501C includes a region between the terminal 519B and the conductive film 511B. The insulating film 501C has an opening 591B.

The terminal 519B is electrically connected to the conductive film 511B through the opening 591B. In addition, the conductive film 511B is electrically connected to the pixel circuit 530($i,j$). Note that for example, when the first electrode 751($i,j$) or the first conductive film is used as the reflective film, a surface serving as a contact of the terminal 519B faces in the same direction as a surface of the first electrode 751($i,j$) that faces light incident on the first display element 750($i,j$).

Thus, power or signals can be supplied to the pixel circuit through the terminal. As a result, a novel display panel that is highly convenient or reliable can be provided.

The first display element 750($i,j$) of the display panel in this embodiment includes a layer 753 containing a liquid crystal material, the first electrode 751($i,j$), and a second electrode 752. The second electrode 752 is positioned such that an electric field which controls the alignment of the liquid crystal material is generated between the second electrode 752 and the first electrode 751($i,j$).

The display panel in this embodiment also includes an alignment film AF1 and an alignment film AF2. The alignment film AF2 is provided such that the layer 753 containing a liquid crystal material is placed between the alignment film AF1 and the alignment film AF2.

The second display element 550($i,j$) of the display panel in this embodiment includes a third electrode 551($i,j$), a fourth electrode 552, and a layer 553($j$) containing a light-emitting organic compound.

The fourth electrode 552 includes a region overlapping with the third electrode 551($i,j$). The layer 553($j$) containing a light-emitting organic compound is provided between the third electrode 551 and the fourth electrode 552. The third electrode 551($i,j$) is electrically connected to the pixel circuit 530($i,j$) at a connection portion 522.

The pixel 702($i,j$) of the display panel in this embodiment includes a coloring film CF1, a light-blocking film BM, an insulating film 771, and a functional film 770P.

The coloring film CF1 includes a region overlapping with the first display element 750($i,j$). The light-blocking film BM has an opening in a region overlapping with the first display element 750($i,j$).

The insulating film 771 is provided between the coloring film CF1 and the layer 753 containing a liquid crystal material or between the light-blocking film BM and the layer 753 containing a liquid crystal material. The insulating film 771 can reduce unevenness due to the thickness of the coloring film CF1. Alternatively, impurities can be prevented from being diffused from the light blocking film BM, the coloring film CF1, or the like to the layer 753 containing a liquid crystal material The functional film 770P includes a region overlapping with the first display element 750($i,j$). The functional film 770P is provided such that a substrate 770 is placed between the functional film 770P and the first display element 750 ($i,j$).

The display panel in this embodiment also includes a substrate 570, the substrate 770, and a functional layer 520.

The substrate 770 includes a region overlapping with the substrate 570. The functional layer 520 is provided between the substrate 570 and the substrate 770.

The functional layer 520 includes the pixel circuit 530(i, j), the second display element 550(i,j), an insulating film 521, and an insulating film 528.

The insulating film 521 is provided between the pixel circuit 530(i,j) and the second display element 550(i,j).

The insulating film 528 is provided between the insulating film 521 and the substrate 570, and has an opening in a region overlapping with the second display element 550(i,j). The insulating film 528 along the edge of the third electrode 551 can avoid a short circuit between the third electrode 551 and the fourth electrode 552.

The display panel in this embodiment also includes a bonding layer 505, a sealant 705, and a structure body KB1.

The bonding layer 505 is provided between the functional layer 520 and the substrate 570 and has a function of bonding the functional layer 520 and the substrate 570.

The sealant 705 lies between the functional layer 520 and the substrate 770 and has a function of bonding the functional layer 520 and the substrate 770.

The structure body KB1 is provided for making a predetermined gap between the functional layer 520 and the substrate 570.

The display panel in this embodiment also includes a terminal 519C, a conductive film 511C, and a conductor CP.

The insulating film 501C includes a region placed between the terminal 519C and the conductive film 511C. The insulating film 501C has an opening 591C.

The terminal 519C is electrically connected to the conductive film 511C through the opening 591C. The conductive film 511C is electrically connected to the pixel circuit 530(i,j).

The conductor CP is placed between the terminal 519C and the second electrode 752, and electrically connects the terminal 519C and the second electrode 752. For example, a conductive particle can be used as the conductor CP.

The driver circuit GD is electrically connected to the scan line G1(i). The driver circuit GD includes a transistor MD, for example. In the transistor MD, the semiconductor film 508 is formed using an oxide semiconductor, for example. An In-M oxide (M is Ti, Ga, Sn, Y, Zr, La, Ce, Nd, or Hf) or an In-M-Zn oxide can be used for the semiconductor film 508. In the case where the semiconductor film 508 is formed of an In-M-Zn oxide, it is preferable to use a target including a polycrystalline In-M-Zn oxide as the sputtering target. The use of the target including a polycrystalline In-M-Zn oxide facilitates formation of the semiconductor film 508 having crystallinity. Note that the atomic ratio of metal elements in the formed semiconductor film 508 varies within a range of ±40% as an error of the atomic ratio of metal elements of the above sputtering target. For example, when a sputtering target with an atomic ratio of In:Ga:Zn=4:2:4.1 is used, an atomic ratio of In:Ga:Zn in the semiconductor film 508 may be 4:2:3 or its vicinity. The semiconductor film 508 can have a stacked structure including two or more layers. When the semiconductor film 508 has a two-layer structure, for example, each thickness of the first oxide semiconductor film and the second oxide semiconductor film is greater than or equal to 3 nm and less than or equal to 200 nm, preferably greater than or equal to 3 nm and less than or equal to 100 nm, further preferably greater than or equal to 3 nm and less than or equal to 50 nm.

Specifically, a transistor including a semiconductor film that can be formed in the same process as the transistor included in the pixel circuit 530(i,j) can be used as the transistor MD (see FIG. 8).

The driver circuit SD is electrically connected to the signal line S1(j). The driver circuit SD is electrically connected to a terminal that can be formed in the same process as, for example, the terminal 519B or the terminal 519C with the use of a conductive material.

FIG. 11, FIG. 12A, FIG. 13, and FIG. 14 each illustrate the structure of the display panel of one embodiment of the present invention in a manufacturing process. FIG. 11, FIG. 12A, FIG. 13, and FIG. 14 are is cross-sectional views taken along lines X1-X2, X3-X4, X5-X6, X7-X8, and X9-X10 in FIG. 7.

<Method for Manufacturing Display Panel>

A method for manufacturing a display panel described in this embodiment includes the following steps.

First, a process substrate 510 where an oxide layer is formed is prepared. A metal film is formed over the oxide layer, and then the metal film is selectively etched.

As the process substrate, a glass substrate, quartz substrate, sapphire substrate, or plastic substrate that is capable of transmitting laser light in the later process can be used. The oxide layer 510W is formed using silicon oxide, silicon oxynitride, silicon nitride oxide, tungsten oxide, molybdenum oxide, gallium oxide, titanium oxide, or the like. The oxide layer 510W can be formed to have a single-layer structure or a stacked-layer structure using any of the materials. Alternatively, an In-M-Zn oxide film (M is Al, Ti, Ga, Y, Zr, La, Ce, Nd, Sn, or Hf) (e.g., an IGZO film that is a metal oxide film containing In, Ga, and Zn) can be used as the oxide layer 510W. In this embodiment, as an oxide layer over and in contact with the glass substrate, an IGZO film is used. Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number). For the metal film formed over the oxide layer, tungsten, molybdenum, chromium, copper, silver, gold, nickel, an alloy of any of the elements (e.g., tungsten nitride), or the like may be used; in this embodiment, molybdenum is used.

The above metal film formed by etching becomes the first electrode 751(0 capable of functioning as a first conductive film and a wiring or electrode formed using the same layer. Depending on a material used for the oxide layer and conditions for etching the metal film, the bare oxide layer is also removed in some cases. In this embodiment, the bare oxide layer is also removed at the time of etching the metal film.

Next, a resin layer 754 is formed. The resin layer 754 may be formed using an organic material such as polyimide, polyester, polyolefin, polyamide, polycarbonate, or an acrylic resin. In this embodiment, polyimide is used for the resin layer 754. Note that molybdenum that is used for the first electrode 751(i,j) is easy to peel, and is covered with the resin layer 754 so that the first electrode 751(i,j) is prevented from being peeled in the processes.

Figure 11:
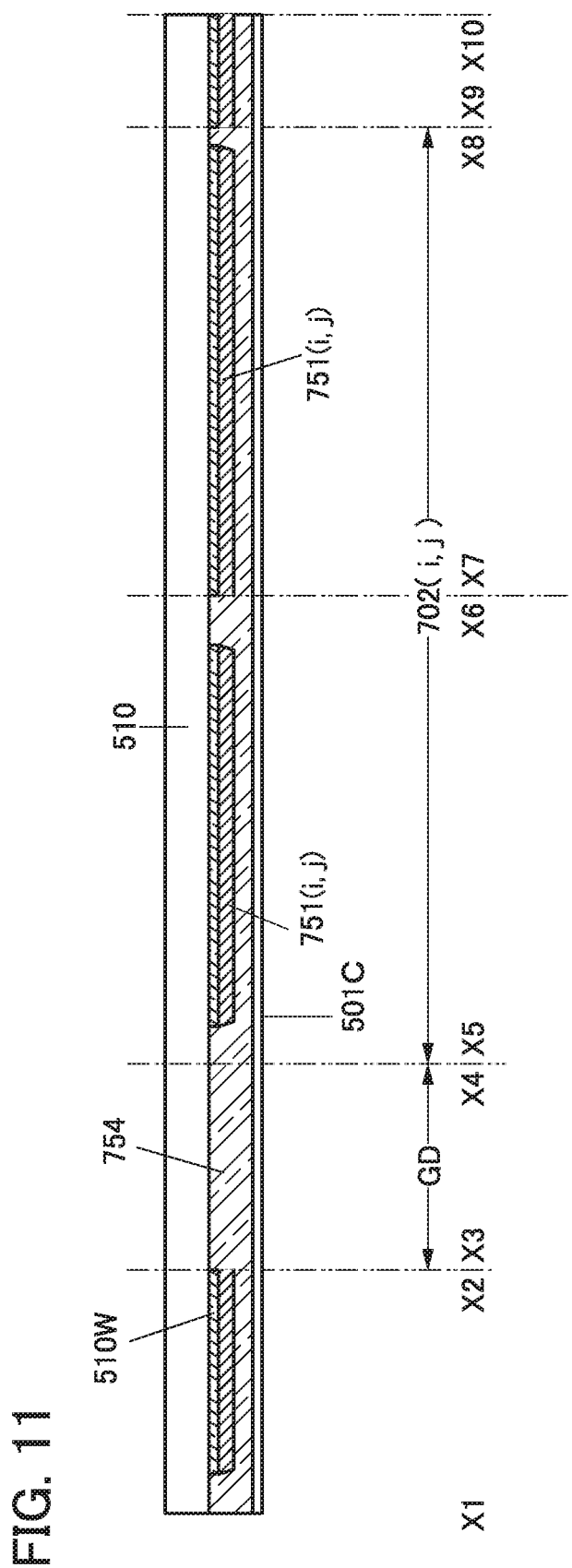
FIG. 11 illustrates a method for manufacturing a display panel of an embodiment.

Next, an insulating film 501C functioning as a barrier layer is formed over the resin layer 754 (see FIG. 11).

The insulating film 501C can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating film 501C may have, for example, a two-layer structure of silicon oxide and silicon nitride or a five-layer structure in which materials selected from the above are combined. The insulating film 501C can be formed by a sputtering method, a CVD method, a thermal oxidation method, a coating method, a printing method, or the like.

The insulating film 501C can prevent or reduce diffusion of impurity elements from the outside. The insulating film 501C is preferably formed using an insulating film having low water permeability. For example, the water vapor transmittance of the insulating film with low water permeability is lower than or equal to $1 \times 10^{-5}$ g/m²×day, preferably lower than or equal to $1 \times 10^{-6}$ g/m²×day, further preferably lower than or equal to $1 \times 10^{-7}$ g/m²×day, still further preferably lower than or equal to $1 \times 10^{-8}$ g/m²×day.

In this embodiment, a silicon oxynitride film having a thickness of approximately 200 nm is used as the insulating film 501C.

Next, the insulating film 501C and the resin layer 754 are selectively etched to form the opening 591A, the opening 591B, and the opening 591C.

The pixel circuit and the second conductive film (including a wiring or electrode formed using the same layer as the second conductive film) which overlaps with the opening 591A are formed (see FIG. 11 and FIG. 12A).

FIG. 12B is an enlarged view of the transistor MD and the transistor M. FIG. 12C is an enlarged view of the switch SW1. For example, the conductive film 512B of the transistor which can be used in the switch SW1 can be used as the second conductive film (see FIG. 12C).

The first conductive film (the first electrode 751($i,j$)) and the second conductive film (the conductive film 512B) can be electrically connected to each other using another conductive film including a region overlapping with the opening 591A. For example, a conductive film that can be formed in the same process as the conductive film 504 can be used as the another conductive film.

A second display element 550($i,j$) that is electrically connected to the pixel circuit 530($i,j$) is formed.

Figure 13:
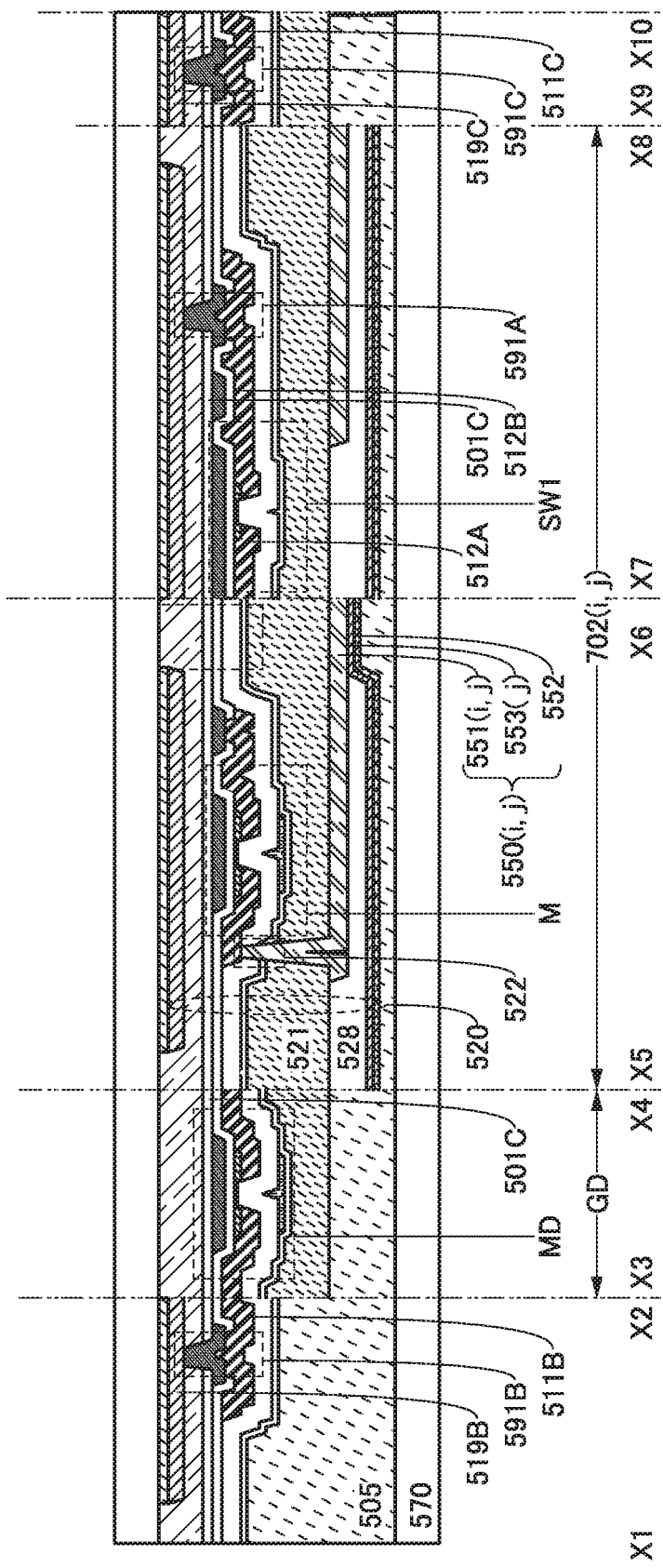
FIG. 13 illustrates a method for manufacturing a display panel of an embodiment.

Next, a substrate 570 is provided with the bonding layer 505 placed therebetween (see FIG. 13). The transistor MD, the transistor M, the switch SW1, the display element 550, and the like are between the substrate 510 and the substrate 570.

In this embodiment, a flexible film is used as the substrate 570.

Figure 14:
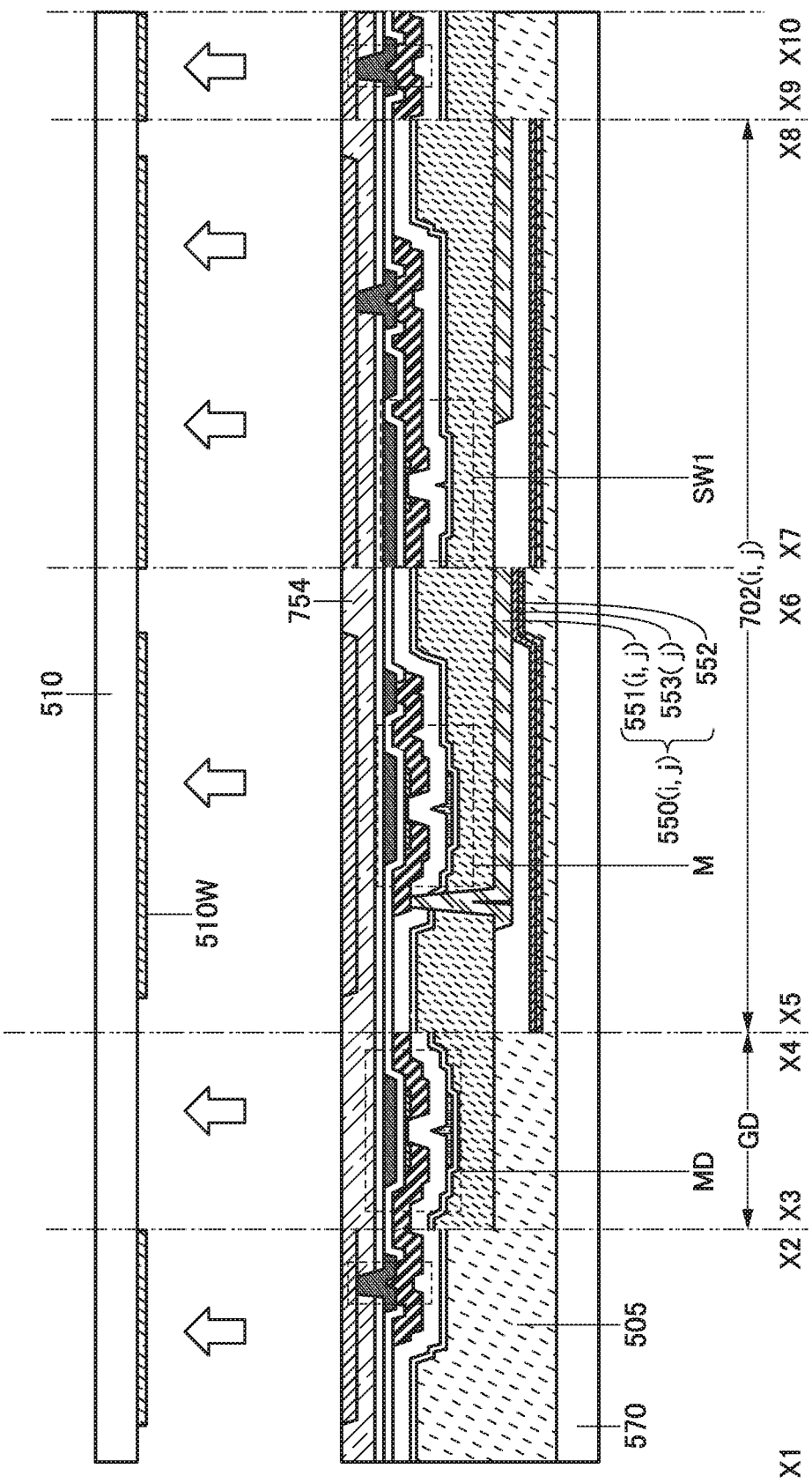
FIG. 14 illustrates a method for manufacturing a display panel of an embodiment.

Next, the process substrate (substrate 510) is separated (see FIG. 14).

Specifically, separation is performed after or during laser light irradiation by a method using laser light (specifically, a laser ablation method) or the like, for example. The separation apparatus described in Embodiment 1 or 2 is used for the separation. FIG. 14 illustrates the substrate 510 where the oxide layer is formed and the resin layer that are separated from each other. Although a portion in the resin layer where the first conductive film is not formed is actually projected, it is not emphasized or illustrated because the oxide layer is thin.

Next, an alignment film AF1 is formed adjacently to a conductive film 751$a$ and the insulating film 501C.

A film containing soluble polyimide that is used as the alignment film AF1 is formed by a printing method, for example. In the case where the film containing soluble polyimide is used, the temperature of heat transferred to the second display element 550($i,j$) in formation of the alignment film AF1 can be lower than that when a method using a precursor of polyimide, such as a polyamic acid, is employed. As a result, the productivity of the display panel can be improved. Thus, a manufacturing method for a novel display panel that is highly convenient or reliable can be provided.

Next, the first display element 750($i,j$) is formed (see FIG. 8). In this embodiment, a substrate formed using a resin material is used as the substrate 770. In addition, the use of the substrate formed using the resin material as the substrate 770 can provide a display panel that is resistant to shocks from the outside and hardly broken. The device can be compact by bending part of the substrate 770.

Note that this embodiment can be combined with any of the other embodiments in this specification as appropriate.

Embodiment 4

In this embodiment, the structure of an input/output device of one embodiment of the present invention will be described with reference to FIG. 15.

Figure 15:
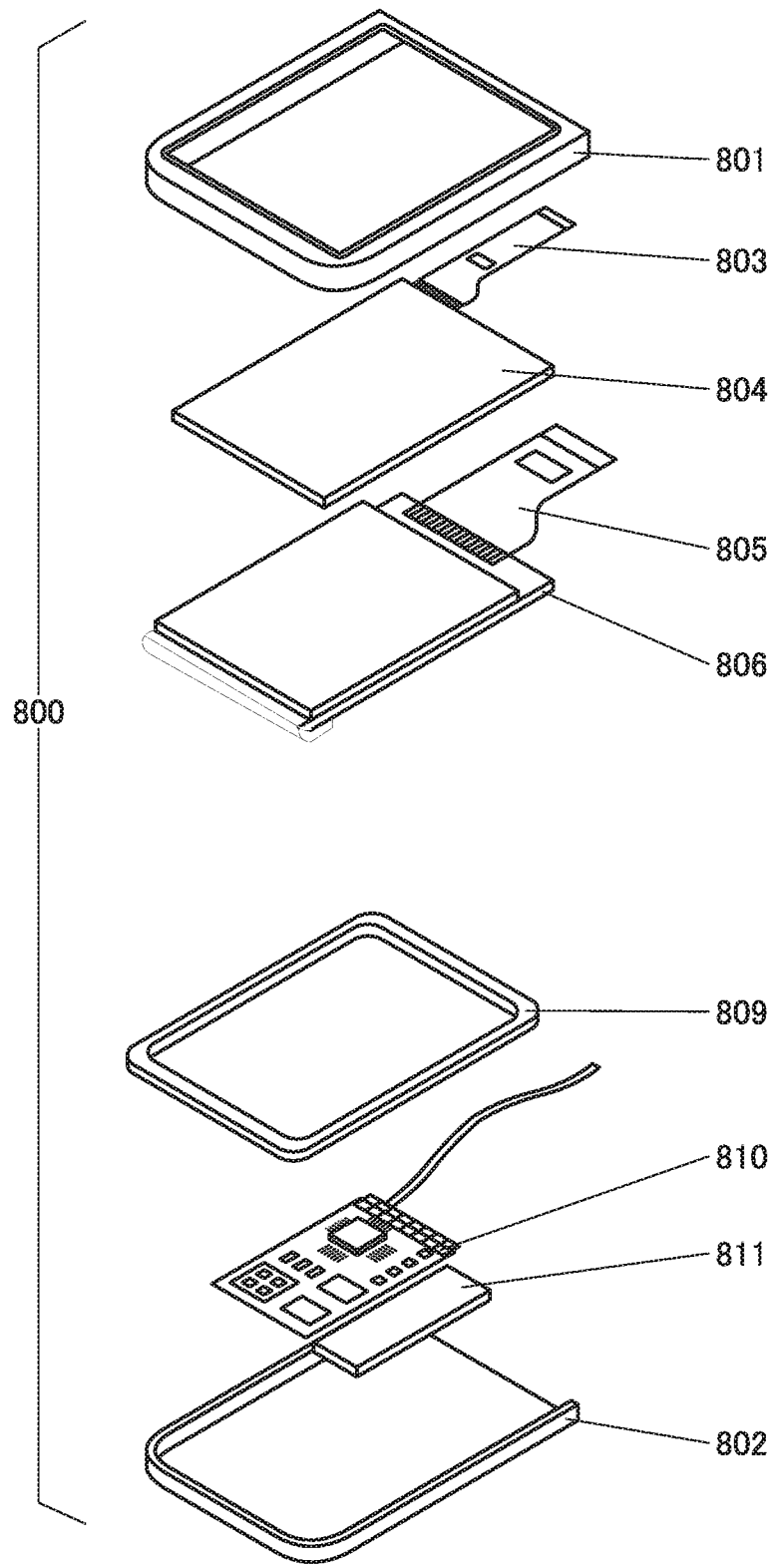
FIG. 15 illustrates a structure of an input/output device of an embodiment.

FIG. 15 is an exploded view of a structure of an input/output device 800.

The input/output device 800 includes a display panel 806 and a touch sensor 804 having a region overlapping with the display panel 806. Note that the input/output device 800 can function as a touch panel.

The input/output device 800 is provided with a driver circuit 810 for driving the touch sensor 804 and the display panel 806, a battery 811 for supplying power to the driver circuit 810, and a housing where the touch sensor 804, the display panel 806, the driver circuit 810, and the battery 811 are stored.

<<Touch Sensor 804>>

The touch sensor 804 includes a region overlapping with the display panel 806. Note that an FPC 803 is electrically connected to the touch sensor 804.

For the touch sensor 804, a resistive touch sensor, a capacitive touch sensor, or a touch sensor using a photoelectric conversion element can be used, for example.

Note that the touch sensor 804 may be used as part of the display panel 806. For example, a transistor of the touch sensor and a transistor connected to the display element may be formed on the same substrate.

<<Display Panel 806>>

For example, the display panel described in Embodiment 1 can be used as the display panel 806. A plastic film is used as the substrate. The plastic film can be bent partly to be compact. Note that an FPC 805 and the like are electrically connected to the display panel 806.

<<Driver Circuit 810>>

As the driver circuit 810, a power supply circuit or a signal processing circuit can be used, for example. Power supplied from the battery or an external commercial power supply may be utilized.

The signal processing circuit has a function of outputting a video signal, a clock signal, and the like.

The power supply circuit has a function of supplying predetermined power.

<<Housing>>

An upper cover 801, a lower cover 802 which fits the upper cover 801, and a frame 809 which is stored in a region surrounded by the upper cover 801 and the lower cover 802 can be used for the housing, for example.

The frame 809 has a function of protecting the display panel 806, a function of blocking electromagnetic waves generated by the operation of the driver circuit 810, or a function as a radiator plate.

Metal, a resin, an elastomer, or the like can be used for the upper cover 801, the lower cover 802, or the frame 809.

<<Battery 811>>

The battery 811 has a function of supplying power.

Note that a functional member such as a polarizing plate, a retardation plate, or a prism sheet can be used for the input/output device 800.

Note that this embodiment can be combined with any of the other embodiments in this specification as appropriate.

Embodiment 5

In this embodiment, a structure of an information processing device of one embodiment of the present invention will be described with reference to FIGS. 16A to 16C and FIGS. 17A and 17B.

Figure 16A:
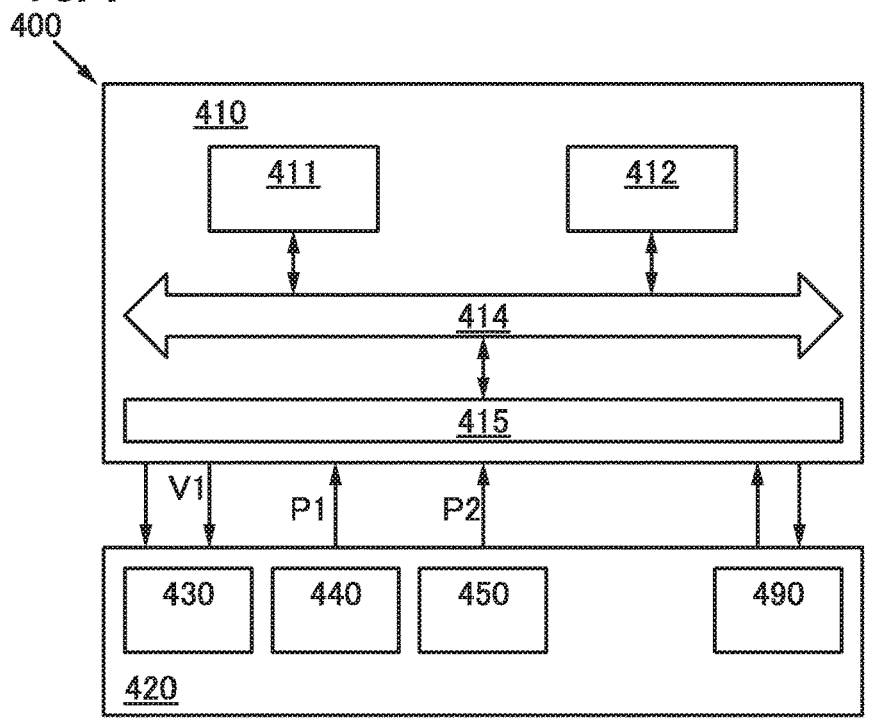
FIGS. 16A to 16C are a block diagram and projection views illustrating structures of information processing devices of embodiments.
Figure 16B:
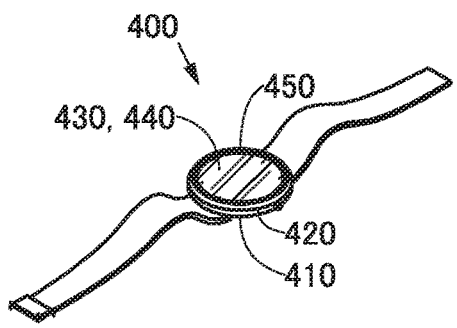
Figure 16C:
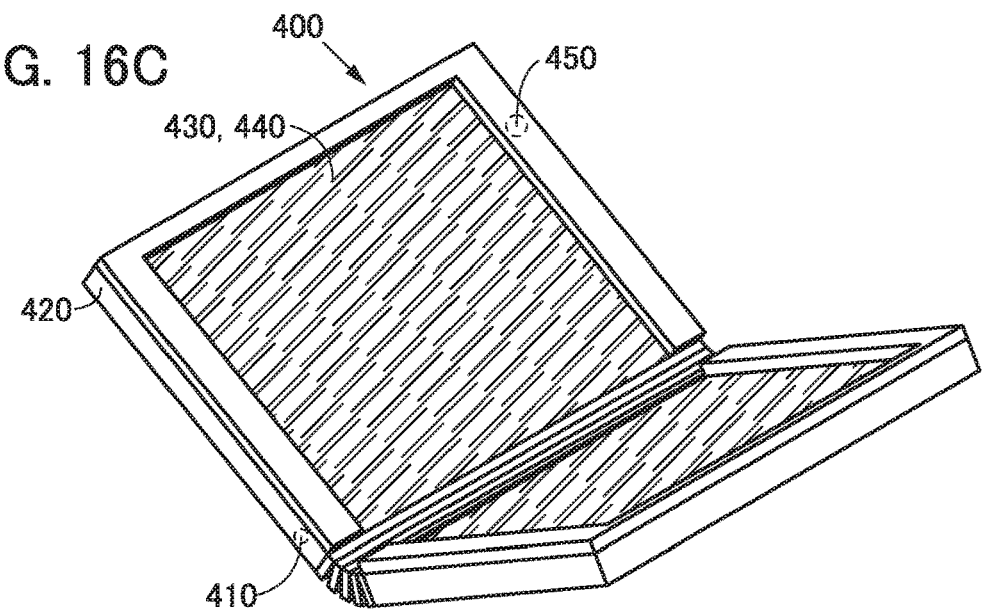

FIG. 16A is a block diagram illustrating the structure of an information processing device 400. FIGS. 16B and 16C are each a projection view illustrating an example of an external view of the information processing device 400.

Figure 17A:
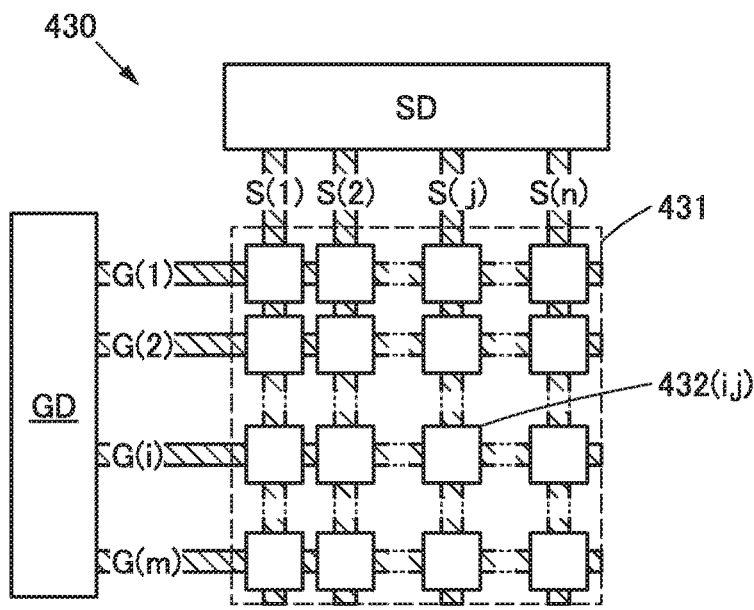
FIGS. 17A to 17C are block diagrams and a circuit diagram illustrating structures of display portions of embodiments.
Figure 17B:
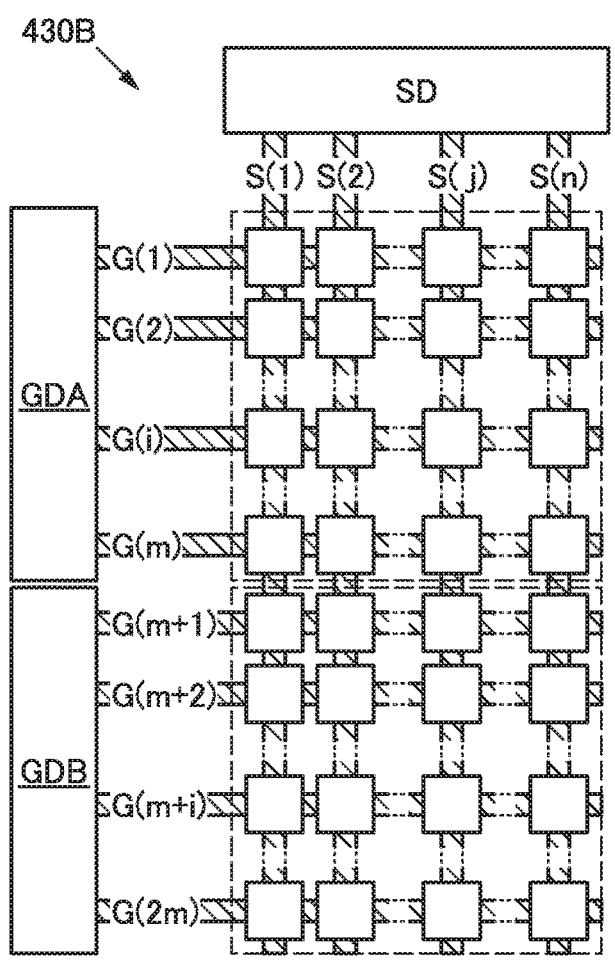
Figure 17C:
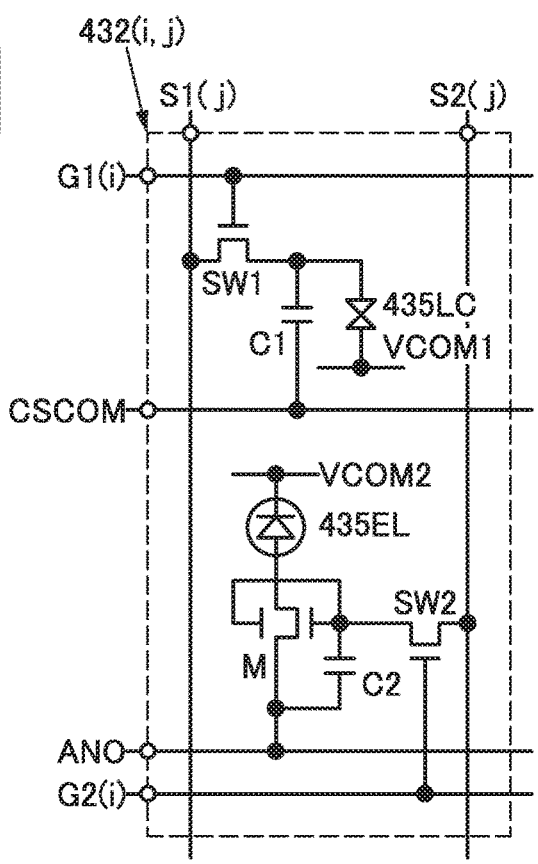

FIG. 17A is a block diagram illustrating the configuration of a display portion 430. FIG. 17B is a block diagram illustrating the configuration of a display portion 430B. FIG. 17C is a circuit diagram illustrating the configuration of a pixel 432($i,j$).

Structure Example of Information Processing Device

The information processing device 400 in this embodiment includes an arithmetic device 410 and an input/output device 420 (see FIG. 16A).

The arithmetic device 410 is configured to receive positional information P1 and supply image information V and control information.

The input/output device 420 is configured to supply the positional information P1 and receive the image information V and the control information.

The input/output device 420 includes the display portion 430 that displays the image information V and an input portion 440 that supplies the positional information P1.

The display portion 430 includes a first display element and a second display element overlapping with the first display element. The display portion 430 further includes a first pixel circuit for driving the first display element and a second pixel circuit for driving the second display element.

The input portion 440 is configured to detect the position of a pointer and supply the positional information P1 determined on the basis of the position.

The arithmetic device 410 is configured to determine the moving speed of the pointer on the basis of the positional information P1.

The arithmetic device 410 is configured to determine the contrast or brightness of the image information V on the basis of the moving speed.

The information processing device 400 in this embodiment includes the input/output device 420 that supplies the positional information P1 and receives the image information V and the arithmetic device 410 that receives the positional information P1 and supplies the image information V. The arithmetic device 410 is configured to determine the contrast or brightness of the image information V on the basis of the moving speed of the positional information P1.

With this structure, eyestrain on a user caused when the display position of image information is moved can be reduced, that is, eye-friendly display can be achieved. Moreover, the power consumption can be reduced and excellent visibility can be provided even in a bright place exposed to direct sunlight, for example. As a result, a novel information processing device that is highly convenient or reliable can be provided.

One embodiment of the present invention includes the arithmetic device 410 or the input/output device 420.

The arithmetic device 410 includes an arithmetic unit 411 and a memory portion 412. The arithmetic device 410 further includes a transmission path 414 and an input/output interface 415 (see FIG. 16A).

The arithmetic unit 411 has a function of, for example, executing a program.

The memory portion 412 has a function of storing a program executed by the arithmetic unit 411, initial information, setting information, an image, or the like.

Specifically, a hard disk, a flash memory, a memory including a transistor including an oxide semiconductor, or the like can be used for the memory portion 412.

The input/output interface 415 includes a terminal or a wiring and is configured to supply and receive information. For example, the input/output interface 415 can be electrically connected to the transmission path 414 and the input/output device 420.

The transmission path 414 includes a wiring and is configured to supply and receive information. For example, the transmission path 414 can be electrically connected to the input/output interface 415. In addition, the arithmetic unit 411 and the storage portion 412 can be electrically connected to the input/output interface 415.

The input/output device 420 includes a display portion 430, an input portion 440, a sensor portion 450, or a communication portion 490.

The display portion 430 includes a display region 431, a driver circuit GD, and a driver circuit SD (see FIG. 17A). For example, the display panel in Embodiment 1 can be used. Thus, the power consumption can be reduced.

A display region 431 includes a plurality of pixels 432($i$,1) to 432($i,n$) arranged in a row direction, a plurality of pixels 432(1,$j$) to 432($m,j$) arranged in a column direction, scan lines G1($i$) and G2($i$) which are electrically connected to the plurality of pixels 432($i$,1) to 432($i,n$), and the signal line S1($j$) and the signal line S2($j$) which are electrically connected to the plurality of pixels 432($i,j$) to 432($m,j$). Note that i is an integer greater than or equal to 1 and less than or equal to m, j is an integer greater than or equal to 1 and less than or equal to n, and each of m and n is an integer greater than or equal to 1.

Note that the pixel 432($i,j$) is electrically connected to the scan line G1($i$), the scan line G2($i$), the signal line S1($j$), the signal line S2($j$), the wiring ANO, the wiring CSCOM, the wiring VCOM1, and the wiring VCOM2 (see FIG. 17C).

The display portion can include a plurality of driver circuits. For example, the display portion 430B can include a driver circuit GDA and a driver circuit GDB (see FIG. 17B).

The driver circuit GD is configured to supply a selection signal on the basis of the control information.

For example, the driver circuit GD is configured to supply a selection signal to one scan line at a frequency of 30 Hz or higher, preferably 60 Hz or higher, on the basis of the control information. Accordingly, moving images can be smoothly displayed.

For example, the driver circuit GD is configured to supply a selection signal to one scan line at a frequency of lower than 30 Hz, preferably lower than 1 Hz, further preferably less than once per minute, on the basis of the control information. Accordingly, a still image can be displayed while flickering is suppressed.

For example, in the case where a plurality of driver circuits is provided, the driver circuits GDA and GDB may supply the selection signals at different frequencies. Specifically, the selection signal can be supplied at a higher frequency to a region on which moving images are smoothly displayed than to a region on which a still image is displayed in a state where flickering is suppressed.

The driver circuit SD is configured to supply an image signal on the basis of the image information V.

The pixel 432(i,j) includes a first display element 435LC and a second display element 435EL overlapping with the first display element 435LC. The pixel 432(i,j) further includes a pixel circuit for driving the first display element 435LC and a pixel circuit for driving the second display element 435EL (see FIG. 17C).

<<First Display Element 435LC>>

For example, a display element having a function of controlling light reflection or transmission can be used as the first display element 435LC. For example, a combined structure of a polarizing plate and a liquid crystal element or a MEMS shutter display element can be used. The use of a reflective display element can reduce power consumption of a display panel. Specifically, a reflective liquid crystal display element can be used as the display element 435LC.

The first display element 435LC includes a first electrode, a second electrode, and a liquid crystal layer. The liquid crystal layer contains a liquid crystal material whose orientation is controlled by voltage applied between the first electrode and the second electrode. For example, the orientation of the liquid crystal material can be controlled by an electric field in the thickness direction (also referred to as the vertical direction), the horizontal direction, or the diagonal direction of the liquid crystal layer.

<<Second Display Element 435EL>>

A display element having a function of emitting light can be used as the second display element 435EL, for example. Specifically, an organic EL element can be used as the second display element 435EL.

Specifically, an organic EL element which emits white light can be used as the second display element 435EL. Alternatively, an organic EL element which emits blue light, green light, or red light can be used as the second display element 435EL.

<<Pixel Circuit>>

A circuit having a function of driving the first display element 435LC or the second display element 435EL can be used as the pixel circuit.

A switch, a transistor, a diode, a resistor, an inductor, a capacitor, or the like can be used in the pixel circuit.

For example, one or a plurality of transistors can be used as a switch. Alternatively, a plurality of transistors connected in parallel, in series, or in combination of parallel connection and series connection can be used as a switch.

<<Transistor>>

For example, a semiconductor film formed in the same process can be used for transistors in the driver circuit and the pixel circuit.

For example, bottom-gate transistors, top-gate transistors, or the like can be used.

For example, a manufacturing line for a bottom-gate transistor including an amorphous silicon film as a semiconductor film can be easily remodeled into a manufacturing line for a bottom-gate transistor including an oxide semiconductor as a semiconductor. Furthermore, for example, a manufacturing line for a top-gate transistor including a polysilicon film as a semiconductor film can be easily remodeled into a manufacturing line for a top-gate transistor including an oxide semiconductor as a semiconductor.

For example, a transistor including a semiconductor containing an element belonging to Group 14 can be used. Specifically, a semiconductor containing silicon can be used for a semiconductor film. For example, single crystal silicon, a polysilicon film, a microcrystalline silicon film, or an amorphous silicon film can be used for the semiconductor film of the transistor.

Note that the temperature for forming a transistor using a polysilicon film in a semiconductor film is lower than the temperature for forming a transistor using single crystal silicon in a semiconductor film.

In addition, the transistor using a polysilicon film in a semiconductor film has higher field-effect mobility than the transistor using an amorphous silicon film in a semiconductor film, and therefore enables a higher aperture ratio of pixel. Moreover, pixels arranged at extremely high density, a gate driver circuit, and a source driver circuit can be formed over the same substrate. As a result, the number of components included in an electronic device can be reduced.

In addition, the transistor using a polysilicon film as a semiconductor film has higher reliability than the transistor using an amorphous silicon film as a semiconductor film.

For example, a transistor including an oxide semiconductor can be used. Specifically, an oxide semiconductor containing indium or an oxide semiconductor containing indium, gallium, and zinc can be used for a semiconductor film.

For example, a transistor having a lower leakage current in an off state than a transistor using an amorphous silicon film for a semiconductor film can be used. Specifically, a transistor that uses an oxide semiconductor for a semiconductor film can be used.

Accordingly, the pixel circuit can hold an image signal for a longer time than a pixel circuit including a transistor that uses an amorphous silicon film for a semiconductor film. Specifically, the selection signal can be supplied with a frequency of lower than 30 Hz, preferably lower than 1 Hz, and further preferably less than once per minute while flickering is suppressed. Consequently, eyestrain on a user of the information processing device can be reduced, and power consumption for driving can be reduced.

<<Input Portion 440>>

Any of a variety of human interfaces or the like can be used as the input portion 440 (see FIG. 16A).

For example, a keyboard, a pointing device, a touch sensor, a microphone, a camera, or the like can be used as the input portion 440. Note that a touch sensor having a region overlapping with the display portion 430 can be used. An input/output device that includes the display portion 430 and a touch sensor having a region overlapping with the display portion 430 can be referred to as a touch panel.

For example, a user can make various gestures (e.g., tap, drag, swipe, and pinch in) using his/her finger as a pointer on the touch panel.

The arithmetic device 410, for example, analyzes information on the position, track, or the like of the finger on the touch panel and determines that a specific gesture is supplied when the analysis results meet predetermined conditions. Therefore, the user can supply a certain operation instruction associated with a certain gesture by using the gesture.

For instance, the user can supply a "scrolling instruction" for changing a portion where image information is displayed by using a gesture of touching and moving his/her finger on the touch panel.

<<Sensor Portion 450>>

The sensor portion 450 is configured to acquire information P2 by detecting the surrounding state.

For example, a camera, an acceleration sensor, a direction sensor, a pressure sensor, a temperature sensor, a humidity sensor, a proximity sensor, an illuminance sensor, or a global positioning system (GPS) signal receiving circuit can be used as the sensor portion 450.

For example, when the arithmetic device 410 determines that the ambient light level measured by an illuminance sensor of the sensor portion 450 is sufficiently higher than the predetermined illuminance, image information is displayed using the first display element 435LC. When the arithmetic device 410 determines that the ambient light level measured by the illuminance sensor is dim, image information is displayed using the first display element 435LC and the second display element 435EL. When the arithmetic device 410 determines that the ambient light level measured by the illuminance sensor is dark, image information is displayed using the second display element 435EL.

Specifically, an image is displayed with a reflective liquid crystal element and/or an organic EL element depending on the ambient brightness.

Thus, image information can be displayed in such a manner that, for example, a reflective display element is used in an environment with strong external light and a self-luminous display element is used in a dim environment. As a result, a novel information processing device that has lower power consumption and is highly convenient or reliable can be provided.

For example, a sensor that is configured to measure the chromaticity of ambient light can be used in the sensor portion 450. Specifically, a CCD camera or the like can be used. Thus, white balance can be adjusted depending on the chromaticity of ambient light sensed by the sensor portion 450.

Specifically, in the first step, imbalance disruption of white balance of ambient light is measured.

In the second step, the light intensity of a color which is insufficient in an image to be displayed by the first display element using reflection of ambient light is estimated.

In the third step, ambient light is reflected by the first display element, and light is emitted from the second display element so that light of the insufficient color is supplemented, whereby an image is displayed.

In this manner, display can be performed with adjusted white balance by utilizing light reflected by the first display element and light emitted from the second display element. Thus, a novel information processing device which can display an image with low power consumption or with adjusted white balance and which is highly convenient and reliable can be provided.

<<Communication Portion 490>>

The communication portion 490 has a function of supplying and acquiring information to/from a network.

Image information may be generated on the basis of information of the usage environment of the information processing device acquired by the sensor portion 450. For example, user's favorite color can be used as the background color of the image information depending on the acquired ambient brightness or the like (see FIG. 16B).

Image information may be generated on the basis of received information delivered to a specific space using the communication portion 490. For example, educational materials can be fed from a classroom of a school, a university, or the like, and displayed to be used as a schoolbook. Alternatively, materials distributed from a conference room in, for example, a company, can be received and displayed (see FIG. 16C).

Embodiment 6

In this embodiment, a display module and electronic devices which include a display panel of one embodiment of the present invention will be described with reference to FIGS. 18A to 18H.

FIGS. 18A to 18G illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 18A:
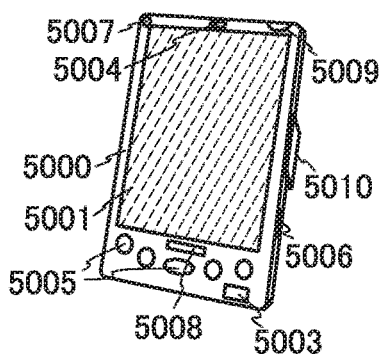
FIGS. 18A to 18H each illustrate an electronic device of an embodiment.
Figure 18B:
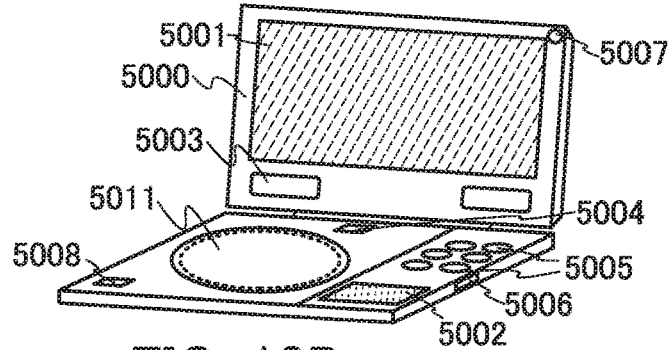
Figure 18C:
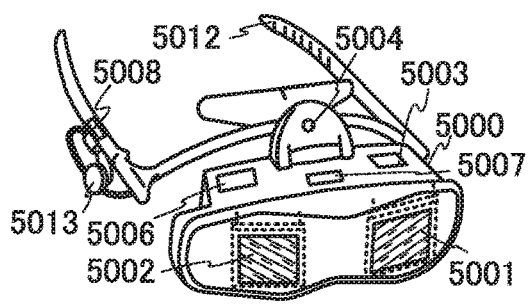
Figure 18D:
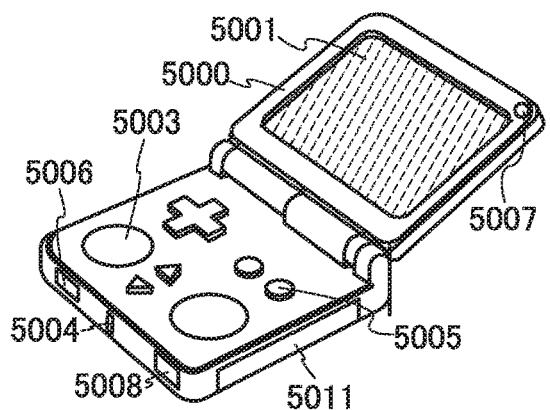
Figure 18E:
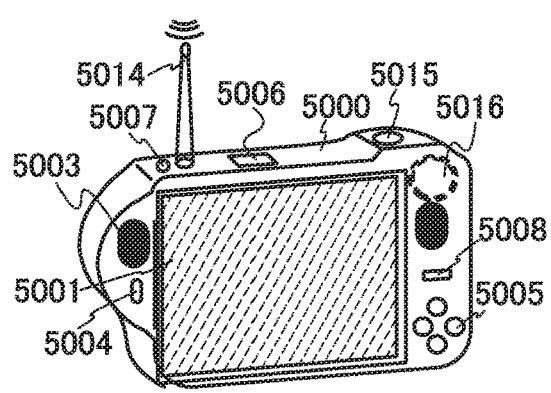
Figure 18F:
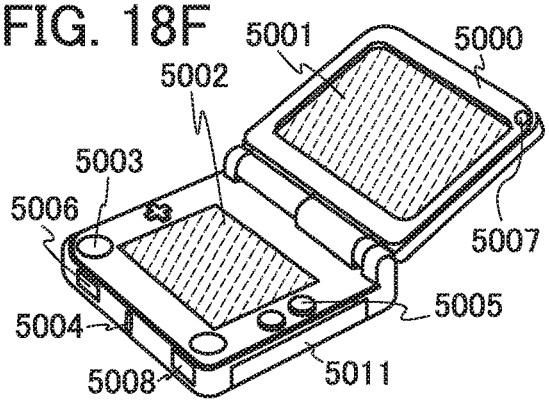
Figure 18G:
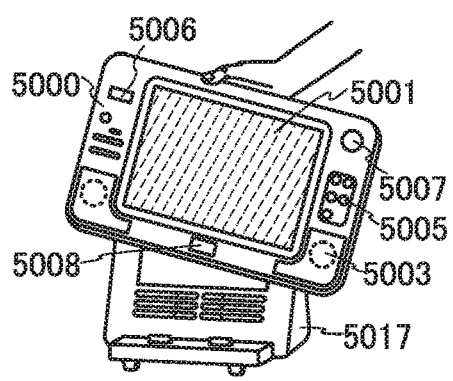

FIG. 18A illustrates a mobile computer, which can include a switch 5009, an infrared port 5010, and the like in addition to the above components. FIG. 18B illustrates a portable image reproducing device (e.g., a DVD player), which is provided with a memory medium and can include a second display portion 5002, a memory medium reading portion 5011, and the like in addition to the above components. FIG. 18C illustrates a goggle-type display, which can include the second display portion 5002, a support portion 5012, an earphone 5013, and the like in addition to the above components. FIG. 18D illustrates a portable game machine, which can include the memory medium reading portion 5011 and the like in addition to the above components. FIG. 18E illustrates a digital camera, which has a television reception function and can include an antenna 5014, a shutter button 5015, an image receiving portion 5016, and the like in addition to the above components. FIG. 18F illustrates a portable game machine, which can include the second display portion 5002, the memory medium reading portion 5011, and the like in addition to the above components. FIG. 18G illustrates a portable television receiver which can include a charger 5017 capable of transmitting and receiving signals, and the like in addition to the above components.

The electronic devices illustrated in FIGS. 18A to 18G can have a variety of functions, such as a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a memory medium and displaying the program or data on a display portion. Furthermore, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions of the electronic devices in FIGS. 18A to 18G are not limited thereto, and the electronic devices can have a variety of functions.

Figure 18H:
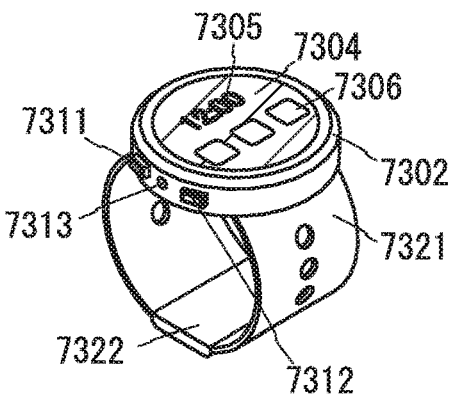

FIG. 18H illustrates a smart watch, which includes a housing 7302, a display panel 7304, operation buttons 7311 and 7312, a connection terminal 7313, a band 7321, a clasp 7322, and the like. The substrate which is used for the display panel 7304 is a flexible film substrate, which is light and is less likely to be broken than the glass substrate.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch illustrated in FIG. 18H can have a variety of functions, such as a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be fabricated using the display module described in Embodiment 1 or 3 for the display panel 7304.

Note that this embodiment can be combined with any of the other embodiments in this specification as appropriate.

This application is based on Japanese Patent Application serial No. 2016-059492 filed with Japan Patent Office on Mar. 24, 2016, the entire contents of which are hereby incorporated by reference.

What is claimed is:

1. A method for manufacturing a semiconductor device comprising the steps of:
   forming an oxide layer over a light-transmitting substrate;
   forming a metal layer over the oxide layer;
   forming a resin layer over and in contact with the oxide layer and the metal layer;
   forming an element layer over the resin layer;
   fixing a flexible film to the element layer;
   irradiating the resin layer and the metal layer with light through the light-transmitting substrate after fixing the flexible film to the element layer;
   separating the light-transmitting substrate; and
   making a bottom surface of the metal layer bare.

2. The method for manufacturing a semiconductor device, according to claim 1, wherein the light is emitted from a laser light source.

3. The method for manufacturing a semiconductor device, according to claim 1,
   wherein the element layer comprises an electrode, and
   wherein the electrode is electrically connected to a top surface of the metal layer through an opening formed in the resin layer.

4. The method for manufacturing a semiconductor device, according to claim 1, wherein the metal layer comprises any one of tungsten, molybdenum, chromium, copper, silver, gold, and nickel.

5. The method for manufacturing a semiconductor device, according to claim 1, wherein the oxide layer comprises silicon.

6. The method for manufacturing a semiconductor device, according to claim 1, wherein the element layer comprises a transistor.

7. A method for manufacturing a semiconductor device comprising the steps of:
   forming an oxide layer over a substrate;
   forming a metal layer over the oxide layer;
   forming a resin layer over the metal layer;
   forming a barrier layer over the resin layer;
   forming a layer comprising an element over the barrier layer;
   attaching a film to the layer comprising the element;
   performing light irradiation after side surface treatment is subjected to the substrate or a processing for cutting the substrate is performed;
   starting separation from a side surface of the substrate subjected to the side surface treatment or to the cutting processing; and
   separating the substrate,
   wherein the oxide layer is in contact with the metal layer.

8. The method for manufacturing a semiconductor device, according to claim 7, wherein the light irradiation is performed by irradiating the resin layer with light emitted from a laser light source.

9. The method for manufacturing a semiconductor device, according to claim 7, wherein the substrate is a light-transmitting substrate.

10. The method for manufacturing a semiconductor device, according to claim 7,
    wherein the element comprises an electrode, and
    wherein the electrode is electrically connected to a top surface of the metal layer through an opening formed in the resin layer.

11. The method for manufacturing a semiconductor device, according to claim 7, wherein the metal layer comprises any one of tungsten, molybdenum, chromium, copper, silver, gold, and nickel.

12. The method for manufacturing a semiconductor device, according to claim 7, wherein the oxide layer comprises silicon.

13. The method for manufacturing a semiconductor device, according to claim 7, wherein the element comprises a transistor.

* * * * *